(12) United States Patent
Hirase et al.

(10) Patent No.: US 11,251,216 B2
(45) Date of Patent: Feb. 15, 2022

(54) IMAGING DEVICE

(71) Applicant: Panasonic Intellectual Property Management Co., Ltd., Osaka (JP)

(72) Inventors: Junji Hirase, Osaka (JP); Yoshinori Takami, Toyama (JP); Yoshihiro Sato, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 57 days.

(21) Appl. No.: 16/535,963

(22) Filed: Aug. 8, 2019

(65) Prior Publication Data

US 2020/0083274 A1 Mar. 12, 2020

(30) Foreign Application Priority Data

Sep. 6, 2018 (JP) .............................. JP2018-167085

(51) Int. Cl.
*H01L 27/146* (2006.01)
(52) U.S. Cl.
CPC .. *H01L 27/14643* (2013.01); *H01L 27/14609* (2013.01); *H01L 27/14679* (2013.01)
(58) Field of Classification Search
None
See application file for complete search history.

(56) References Cited

U.S. PATENT DOCUMENTS

2008/0029793 A1 2/2008 Watanabe et al.
2011/0254004 A1* 10/2011 Yamazaki ........... H01L 29/4908
257/57
2014/0027618 A1 1/2014 Goto
2014/0043510 A1 2/2014 Kasuga et al.
2017/0150078 A1* 5/2017 Ukai .................... H04N 5/3745
2017/0250216 A1* 8/2017 Sato .................. H01L 27/14614
2017/0264840 A1 9/2017 Hirase et al.

FOREIGN PATENT DOCUMENTS

| JP | 2012-004545 | 1/2012 |
| JP | 2012-160750 | 8/2012 |
| JP | 2012-209342 | 10/2012 |
| JP | 2017-168823 | 9/2017 |
| WO | 2012/147302 | 11/2012 |

* cited by examiner

*Primary Examiner* — Alexander G Ghyka
(74) *Attorney, Agent, or Firm* — McDermott Will and Emery LLP

(57) ABSTRACT

An imaging device includes: a semiconductor layer including a first region of a first conductivity, a second region of a second conductivity opposite to the first conductivity, and a third region of the second conductivity; a photoelectric converter electrically connected to the first region and converting light into charge; a first transistor including a first source, a first drain, and a first gate above the second region, the first region corresponding to the first source or drain; and a second transistor including a second source, a second drain, and a second gate of the second conductivity above the third region, the first region corresponding to the second source or drain, and the second gate being electrically connected to the first region. The concentration of an impurity of the second conductivity in the third region is higher than that of an impurity of the second conductivity in the second region.

6 Claims, 10 Drawing Sheets

IMAGING DEVICE

BACKGROUND

1. Technical Field

The present disclosure relates to an imaging device.

2. Description of the Related Art

CCD (charge coupled device) image sensors and CMOS (complementary metal oxide semiconductor) image sensors are widely used in digital cameras and the like. As is well known, these image sensors have photodiodes that are formed on a semiconductor substrate.

Meanwhile, for example, Japanese Unexamined Patent Application Publication No. 2012-209342 proposes a structure in which a photoelectric converter having a photoelectric conversion layer is arranged above a semiconductor substrate. Imaging devices having this kind of structure are sometimes referred to as lamination type imaging devices. In a lamination type imaging device, charge generated by photoelectric conversion is accumulated in a charge accumulation region (referred to as "floating diffusion"). A signal corresponding to the amount of charge accumulated in the charge accumulation region is read via a CCD circuit or a CMOS circuit formed on a semiconductor substrate.

In a lamination type imaging device, when light is radiated onto a photoelectric conversion layer at an extremely high illuminance, the potential of the charge accumulation region rises excessively and there is a risk of a transistor or the like in the signal detection circuit being damaged. Japanese Unexamined Patent Application Publication No. 2012-209342 discloses a circuit in which a protection transistor that prevents the potential of the gate electrode of an output transistor reaching a predetermined value or higher is provided within a pixel. In the circuit in FIG. 1 of Japanese Unexamined Patent Application Publication No. 2012-209342, a diode-connected protection transistor turns on when light having a high illuminance is radiated onto a photoelectric converter. The protection transistor turning on causes excess charge to be discharged to a power source that supplies a power source voltage VDD to the output transistor.

SUMMARY

In one general aspect, the techniques disclosed here feature an imaging device provided with: a semiconductor layer that includes a first region of a first conductivity type, a second region of a second conductivity type that is an opposite conductivity type to the first conductivity type, and a third region of the second conductivity type; a photoelectric converter that is electrically connected to the first region and that converts incident light into charge; a first transistor that includes a first source, a first drain, and a first gate, the first gate being located above the second region; and a second transistor that includes a second source, a second drain, and a second gate of the second conductivity type, the second gate being located above the third region and electrically connected to the first region. The first region corresponds to the first source or the first drain in the first transistor. The first region corresponds to the second source or the second drain in the second transistor. The concentration of an impurity of the second conductivity type in the third region is higher than the concentration of an impurity of the second conductivity type in the second region.

General or specific aspects may be realized by means of an element, a device, a module, or a system. Furthermore, general or specific aspects may be realized by means of any combination of an element, a device, a module, and a system.

Additional benefits and advantages of the disclosed embodiments will be apparent from the specification and drawings. The benefits and/or advantages may be individually provided by the various embodiments or features disclosed in the specification and drawings, which need not all be provided in order to obtain one or more of the same.

Figure 1:
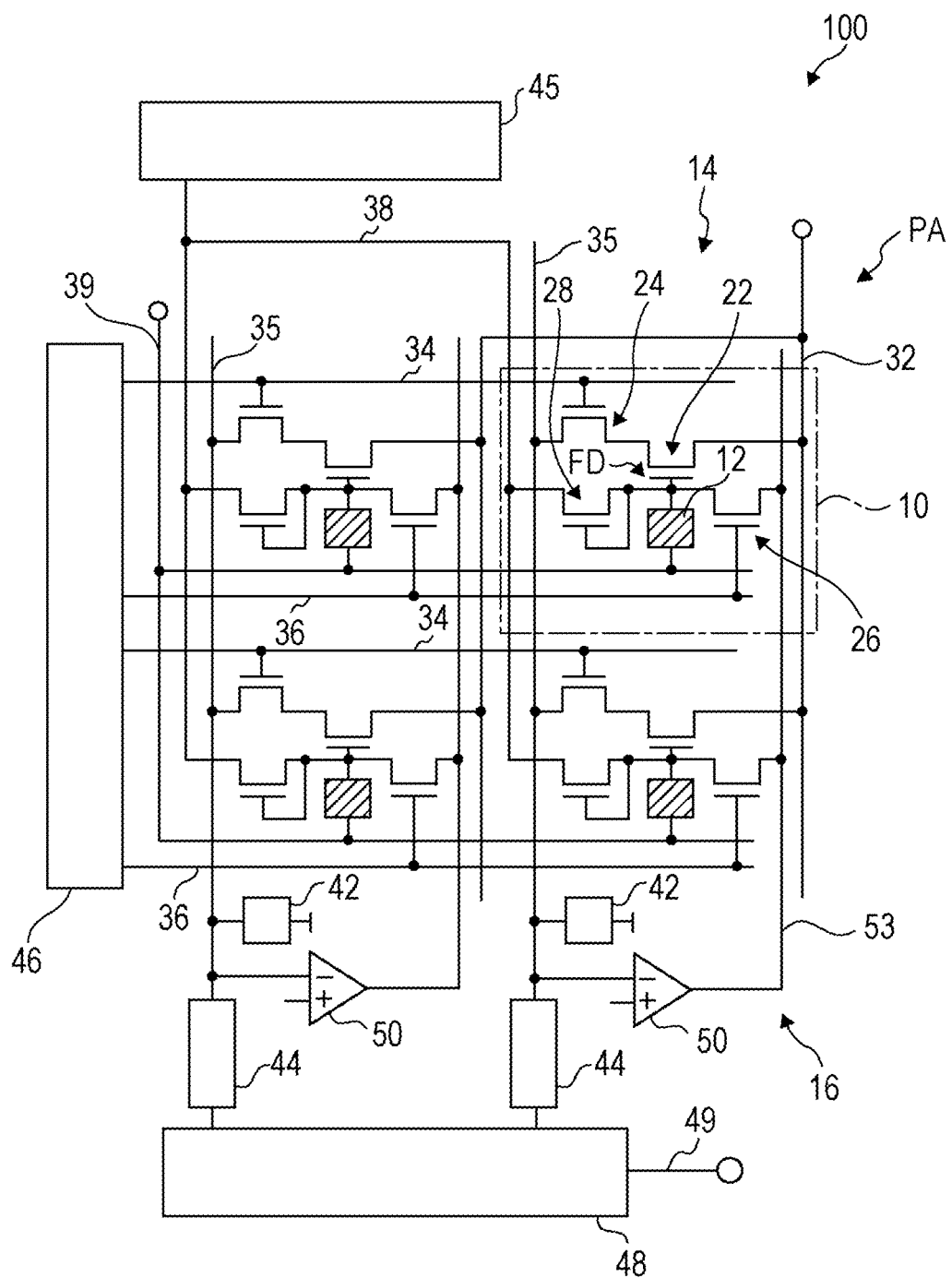
FIG. 1 is a drawing depicting an exemplary circuit configuration of an imaging device according to an embodiment of the present disclosure.

DETAILED DESCRIPTION (Underlying Knowledge Forming Basis of the Present Disclosure)

A lamination type imaging device generally has a connecting section that electrically connects a photoelectric converter and a read circuit formed on a semiconductor substrate. Various p-n junctions are formed in the periphery of contact points between the semiconductor substrate and the connecting section. The connecting section electrically connecting the semiconductor substrate and the photoelectric converter, and impurity regions within the semiconductor substrate in the vicinity of the contact points function as a charge accumulation region that accumulates signal charge generated by the photoelectric converter.

A depletion layer is formed in the vicinity of a p-n junction. Recombination of charge in a depletion layer in the vicinity of a p-n junction can be a cause for the generation of leakage current. The present inventors focused on it being possible for this kind of depletion layer to be formed also below the gate electrode of a transistor in an off-state. For example, the drain (or the source) of a reset transistor that resets the potential of a charge accumulation region is connected to an impurity region within the semiconductor substrate in which signal charge is accumulated. Furthermore, as is apparent from FIG. 1 in Japanese Unexamined Patent Application Publication No. 2012-209342, the drain (or the source) of a protection transistor can also be connected to an impurity region in which signal charge is accumulated. Consequently, the performance of an imaging device may deteriorate due to dark current caused by a depletion layer that has formed below a gate electrode of these transistors.

When a reset transistor is operated in accumulation mode with a predetermined voltage being applied to the gate electrode of the reset transistor, there is a reduction in the dark current that is present when the reset transistor is off. Furthermore, in a case where the conductivity type of the gate electrode of a protection transistor is different from the conductivity type of the source or the drain, a state similar to the accumulation mode can be realized based on the difference in the work function between a p-type semiconductor and an n-type semiconductor, even if a voltage has not been applied to the gate electrode from outside the gate electrode. However, dark current that is present when the protection transistor is off is still large. In particular, when the voltage of the charge accumulation region rises, a depletion layer widens below the gate electrode of the protection transistor and dark current increases. Therefore, further improvement for reducing the dark current that is present when the protection transistor is off is required.
(Overview of Aspects According to the Present Disclosure)

An imaging device according to a first aspect of the present disclosure is provided with:

a semiconductor layer that includes a first region of a first conductivity type, a second region of a second conductivity type that is an opposite conductivity type to the first conductivity type, and a third region of the second conductivity type;

a photoelectric converter that is electrically connected to the first region and that converts incident light into charge;

a first transistor that includes a first source, a first drain, and a first gate, the first gate being located above the second region; and a second transistor that includes a second source, a second drain, and a second gate of the second conductivity type, the second gate being located above the third region and electrically connected to the first region.

The first region corresponds to the first source or the first drain in the first transistor.

The first region corresponds to the second source or the second drain in the second transistor.

The concentration of an impurity of the second conductivity type in the third region is higher than the concentration of an impurity of the second conductivity type in the second region.

According to the first aspect, leakage current can be reduced by suppressing spreading of a depletion layer to below a gate. As a result, it is possible to provide an imaging device that is able to generate higher quality images.

In a second aspect of the present disclosure, for example, in the imaging device according to the first aspect, the impurity of the second conductivity type included in the third region may be the same type of element as the impurity of the second conductivity type included in the second region.

According to this kind of configuration, it is easy to manufacture the imaging device and it is easy to also control the concentration of impurities.

In a third aspect of the present disclosure, for example, in the imaging device according to the first or second aspect, the concentration of the impurity of the second conductivity type in a first predetermined location in the third region may be higher than the concentration of the impurity of the second conductivity type in a second predetermined location in the second region, the second predetermined location may include an intersecting point between a surface of the second region and a line normal to the first gate passing through the center of gravity of the first gate when the imaging device is seen in plan view, and, when an intersecting point between the center line of the first gate in the gate length direction of the first gate and the center line of the second gate in a direction parallel with the gate width direction of the first gate is defined as a specific intersecting point, the first predetermined location may include an intersecting point between a surface of the third region and a line normal to the second gate passing through the specific intersecting point.

According to this kind of configuration, it is possible to suppress a depletion layer spreading to below the second gate regardless of the shape of an n-type impurity region.

In a fourth aspect of the present disclosure, for example, in the imaging device according to any one of the first to third aspects, when the imaging device is seen in plan view, the third region may extend outside the second gate.

According to this kind of configuration, it is possible to sufficiently suppress a depletion layer spreading to below a second gate electrode.

In a fifth aspect of the present disclosure, for example, in the imaging device according to any one of the first to fourth aspects, the concentration of the impurity of the second conductivity type at a location, separated by a predetermined distance from the first region, in the third region may be higher than the concentration of the impurity of the second conductivity type at a location, separated by the predetermined distance from the first region, in the second region.

Furthermore, in a sixth aspect of the present disclosure, for example, in the imaging device according to any one of the first to fourth aspects, the concentration of the impurity of the second conductivity type at a location, adjacent to the first region and below the second gate, in the third region may be higher than the concentration of the impurity of the second conductivity type at a location, adjacent to the first region and below the first gate, in the second region.

Furthermore, an imaging device according to a seventh aspect of the present disclosure is provided with:

a photoelectric converter that converts incident light into charge;

a first region of a first conductivity type that is electrically connected to the photoelectric converter;

a first transistor that has a first source, a first drain, and a first gate electrode, and includes the first region as the first source or the first drain;

a second region of a second conductivity type that is the opposite conductivity type to the first conductivity type, located below the first gate electrode;

a second transistor that has a second source, a second drain, and a second gate electrode of the second conductivity type, includes the first region as the second source or the second drain, and in which the second gate electrode is electrically connected to the first region; and a third region of the second conductivity type located below the second gate electrode, in which the concentration of an impurity of the second conductivity type in the third region is higher than the concentration of an impurity of the second conductivity type in the second region.

Hereinafter, embodiments of the present disclosure will be described in detail with reference to the drawings. It should be noted that the embodiments described hereinafter all represent general or specific examples. The numerical values, the shapes, the materials, the constituent elements, the arrangement of the constituent elements, the mode of connection, the steps, and the order of the steps and so forth given in the following embodiments are examples and are not intended to restrict the present disclosure. The various aspects described in the present specification may be combined with each other provided there are no resulting inconsistencies. Furthermore, from among the constituent elements in the following embodiments, constituent elements that are not mentioned in the independent claims indicating the most significant concepts are described as optional constituent elements. In the following description, constituent elements having substantially the same functions are denoted by common reference numerals, and descriptions thereof have been omitted.

(Embodiment of Imaging Device)

FIG. 1 depicts an exemplary circuit configuration of an imaging device according to an embodiment of the present disclosure. An imaging device 100 depicted in FIG. 1 has a pixel array PA that includes a plurality of unit pixels 10, and peripheral circuits that include load circuits 42, column signal processing circuits 44, a vertical scanning circuit 46, a horizontal signal read circuit 48, and the like. In the configuration exemplified in FIG. 1, the pixel array PA includes the plurality of unit pixels 10 arranged in a matrix form. The plurality of unit pixels 10 are arrayed one-dimensionally or two-dimensionally to thereby form a photosensitive region constituting an imaging region. In FIG. 1, to avoid the drawing becoming complex, four unit pixels 10 arrayed in two-rows by two-columns are depicted from among the plurality of unit pixels 10 arranged in a matrix form. It goes without saying that the number and arrangement of the unit pixels 10 in the pixel array PA is not restricted to this example. For example, the unit pixels 10 can be arrayed one-dimensionally. In this case, the imaging device 100 can be used as a line sensor.

As described in detail later, broadly speaking, each unit pixel 10 has a photoelectric converter 12 and a signal detection circuit 14 that detects signals generated by the photoelectric converter 12. The signal detection circuit 14 is formed on the semiconductor substrate, and the photoelectric converter 12 is arranged above the semiconductor substrate. In other words, here, a lamination type imaging device is given as an example of the imaging device 100. It should be noted that the terms "above" and "below" in the present specification represent relative arrangements among members, and are not used with the intention of restricting the orientation of the imaging device 100 when used. The semiconductor substrate is not restricted to a substrate in which the entirety thereof is a semiconductor layer, and may be an insulation substrate or the like in which a semiconductor layer is provided on a surface of a side on which an imaging region is formed.

The photoelectric converter 12 of the unit pixels 10 receives incident light and generates positive and negative charge (typically positive hole-electron pairs). As depicted, the photoelectric converter 12 of each unit pixel 10 has a connection with an accumulation control line 39. A predetermined voltage is applied to this accumulation control line 39 during operation of the imaging device 100. For example, in a case where positive charge is used as signal charge from among the positive and negative charge generated by photoelectric conversion, a positive voltage of approximately 10 V, for example, is applied to the accumulation control line 39 during operation of the imaging device 100. By applying a predetermined positive voltage to the accumulation control line 39, it is possible to selectively accumulate positive charge (for example, positive holes) in a charge accumulation region from among the positive and negative charge generated by photoelectric conversion. Hereinafter, an example case will be given in which positive charge is used as signal charge from among the positive and negative charge generated by photoelectric conversion.

In the configuration exemplified in FIG. 1, the signal detection circuit 14 of each unit pixel 10 includes an amplification transistor (also referred to as a read transistor) 22 and an address transistor (also referred to as a row selection transistor) 24. In this example, the signal detection circuit 14 further includes a reset transistor 26 and a protection transistor 28. The amplification transistor 22, the address transistor 24, the reset transistor 26, and the protection transistor 28 are typically field-effect transistors (FETs) formed on the semiconductor substrate. Hereinafter, unless otherwise specified, an example will be described in which N-channel MOSFETs are used as transistors.

The gate of the amplification transistor 22 is electrically connected to the photoelectric converter 12. As described later, charge generated by the photoelectric converter 12 is accumulated in a charge accumulation region that partially includes a charge accumulation node (also referred to as a "floating diffusion node") FD between the photoelectric converter 12 and the amplification transistor 22. The drain of the amplification transistor 22 is connected to power source wiring 32 that is a source follower power source that supplies a predetermined power source voltage VDD (of approximately 3.3 V, for example) to each unit pixel 10 during operation of the imaging device 100. The source of the amplification transistor 22 is connected to the drain of the address transistor 24. The amplification transistor 22 outputs a signal voltage that corresponds to the amount of signal charge generated by the photoelectric converter 12.

In this example, the protection transistor 28 is connected to the charge accumulation node FD. The drain (or the source) of the protection transistor 28 is connected to the charge accumulation node FD. The source (or the drain) of the protection transistor 28 is connected to a charge recovery line 38. As depicted in FIG. 1, the gate and the drain (or the source) of the protection transistor 28 are electrically connected to each other. In other words, these have the same potential. If light is radiated onto the photoelectric converter 12 at a high illuminance and thus the amount of charge accumulated in the charge accumulation node FD exceeds a predetermined size, in other words, the potential of the charge accumulation node FD exceeds a predetermined potential, the protection transistor 28 turns on and the excess charge is discharged from the charge accumulation node FD to the charge recovery line 38.

In the configuration exemplified in FIG. 1, the charge recovery line 38 is connected to a voltage supply circuit 45. The voltage supply circuit 45 applies a predetermined voltage to the source (or the drain) of the protection transistor 28 via the charge recovery line 38 during operation of the imaging device 100. Typically, the voltage applied to the charge recovery line 38 is lower than the voltage applied to the power source wiring 32 (here, the power source voltage VDD). As described in detail later, the protection transistor 28 can be made to operate in a more stable manner due to a voltage that is lower than the voltage applied to the power source wiring 32 being supplied to the charge recovery line 38.

The voltage supply circuit 45 is not restricted to a specific power source circuit, and may be a circuit that generates a predetermined voltage or may be a circuit that converts a voltage supplied from another power source into a predetermined voltage. The voltage supply circuit 45 and a circuit that supplies a predetermined voltage to the power source wiring 32 may be different or these circuits may be part of one voltage supply circuit. At least one of the voltage supply circuit 45 and the circuit that supplies the predetermined voltage to the power source wiring 32 may be part of the vertical scanning circuit 46 described later. The imaging device 100 may include a control circuit that controls the voltage supply circuit 45 and the circuit that supplies the predetermined voltage to the power source wiring 32 or the like.

The source of the address transistor 24 is connected to a vertical signal line 35. As depicted, the vertical signal line 35 is provided in each column of the plurality of unit pixels 10, and a load circuit 42 and a column signal processing circuit (also referred to as a "row signal accumulation circuit") 44 are connected to each vertical signal line 35. The load circuit 42 forms a source follower together with the amplification transistor 22. The amplification transistor 22 receives a supply of the power source voltage VDD to the drain, and thereby amplifies the voltage applied to the gate. In other words, the amplification transistor 22 amplifies a signal generated by the photoelectric converter 12.

An address signal line 34 is connected to the gate of the address transistor 24. The address signal line 34 is provided in each row of the plurality of unit pixels 10. The address signal line 34 is connected to the vertical scanning circuit (also referred to as a "row scanning circuit") 46, and the vertical scanning circuit 46 applies a row selection signal that controls the address transistor 24 to be on or off, to the address signal line 34. Thus, a row to be read is selected with rows to be read being scanned in the vertical direction (column direction). The vertical scanning circuit 46 is able to read the output of the amplification transistor 22 of a selected unit pixel 10 to the corresponding vertical signal line 35, by controlling the address transistor 24 to be on or off via the address signal line 34. The arrangement of the address transistor 24 is not restricted to the example depicted in FIG. 1, and may be between the drain of the amplification transistor 22 and the power source wiring 32.

A signal voltage from the unit pixel 10, which is output to the vertical signal line 35 via the address transistor 24, is input to the corresponding column signal processing circuit 44 from among the plurality of column signal processing circuits 44 provided in each row of the plurality of unit pixels 10 corresponding to the vertical signal lines 35. The column signal processing circuits 44 carry out noise-suppression signal processing represented by correlated double sampling, analog-digital conversion (AD conversion), and the like. The column signal processing circuits 44 are connected to the horizontal signal read circuit (also referred to as a "column scanning circuit") 48, and the horizontal signal read circuit 48 sequentially reads signals from the plurality of column signal processing circuits 44 to a horizontal common signal line 49.

In the configuration exemplified in FIG. 1, the signal detection circuit 14 includes the reset transistor 26, the drain of which is connected to the charge accumulation node FD. A reset signal line 36 that has a connection with the vertical scanning circuit 46 is connected to the gate of the reset transistor 26. The reset signal line 36 is provided in each row of the plurality of unit pixels 10 in a manner similar to the address signal line 34. The vertical scanning circuit 46 applies a row selection signal to the address signal line 34, and is thereby able to select, in row units, unit pixels 10 to be reset. In addition, the vertical scanning circuit 46 applies a reset signal that controls the reset transistor 26 to be on or off, to the gate of the reset transistor 26 via the reset signal line 36. The reset transistors 26 of the selected row are thereby turned on. The reset transistors 26 turning on causes the potential of the charge accumulation nodes FD to be reset.

In this example, a feedback line 53 is provided in each column of the plurality of unit pixels 10, and the source of the reset transistor 26 is connected to one of the feedback lines 53. In other words, in this example, the voltage of the feedback line 53 is supplied to the charge accumulation node FD as a reset voltage that initializes the charge of the photoelectric converter 12. Here, an inverting amplifier 50 is provided in each column of the plurality of unit pixels 10, and the aforementioned feedback line 53 is connected to an output terminal in one corresponding inverting amplifier 50. In this way, the peripheral circuits of the imaging device 100 exemplified in FIG. 1 include a plurality of inverting amplifiers 50.

We will now focus on one of the columns of the plurality of unit pixels 10. As depicted, an inverting input terminal of the inverting amplifier 50 is connected to the vertical signal line 35 of that column. Furthermore, the output terminal of the inverting amplifier 50 and the reset transistor 26 of the one or more unit pixels 10 belonging to that column are connected via the feedback line 53. Consequently, when the address transistor 24 and the reset transistor 26 in a unit pixel 10 are on, the inverting input terminal of the inverting amplifier 50 receives the output of the address transistor 24 of that unit pixel 10.

During operation of the imaging device 100, a predetermined voltage (for example, a positive voltage of 1 V or in the vicinity of 1 V) Vref is supplied to a non-inverting input terminal of the inverting amplifier 50. By selecting one of the one or more unit pixels 10 belonging to that column and turning the address transistor 24 and the reset transistor 26 on, it is possible to form a feedback path that negatively feeds back the output of that unit pixel 10. Due to the formation of the feedback path, the voltage of the vertical signal line 35 converges on the voltage Vref that is input to the non-inverting input terminal of the inverting amplifier 50. In other words, due to the formation of the feedback path, the voltage of the charge accumulation node FD is reset to a voltage with which the voltage of the vertical signal line 35 becomes Vref. A voltage of any size within the range of the power source voltage (for example, 3.3 V) and ground (0 V) can be used as the voltage Vref. The inverting amplifier 50 may be referred to as a feedback amplifier. In this way, the imaging device 100 exemplified in FIG. 1 has a feedback circuit 16 that includes the inverting amplifier 50 in part of the feedback path.

As is well known, thermal noise referred to as kTC noise is generated together with a transistor being turned on or off. Noise that is generated together with a reset transistor being turned on or off is referred to as reset noise. After the potential of a charge accumulation region has been reset, reset noise that is generated by the reset transistor being turned off remains in the charge accumulation region prior to the accumulation of signal charge. However, by using feedback, it is possible to reduce reset noise that is generated together with the reset transistor being turned off. Due to the formation of the feedback path, the alternating-current component of the thermal noise is fed back to the source of the reset transistor 26. Details of suppressing reset noise using feedback are described in International Publication No. 2012/147302. The content disclosed in International Publication No. 2012/147302 is incorporated herein in its entirety for reference. In the configuration exemplified in FIG. 1, a feedback path is formed until immediately prior to the reset transistor 26 being turned off, and it is therefore possible to reduce reset noise that is generated together with the reset transistor 26 being turned off.

(Device Structure of Unit Pixel 10)

Figure 2:
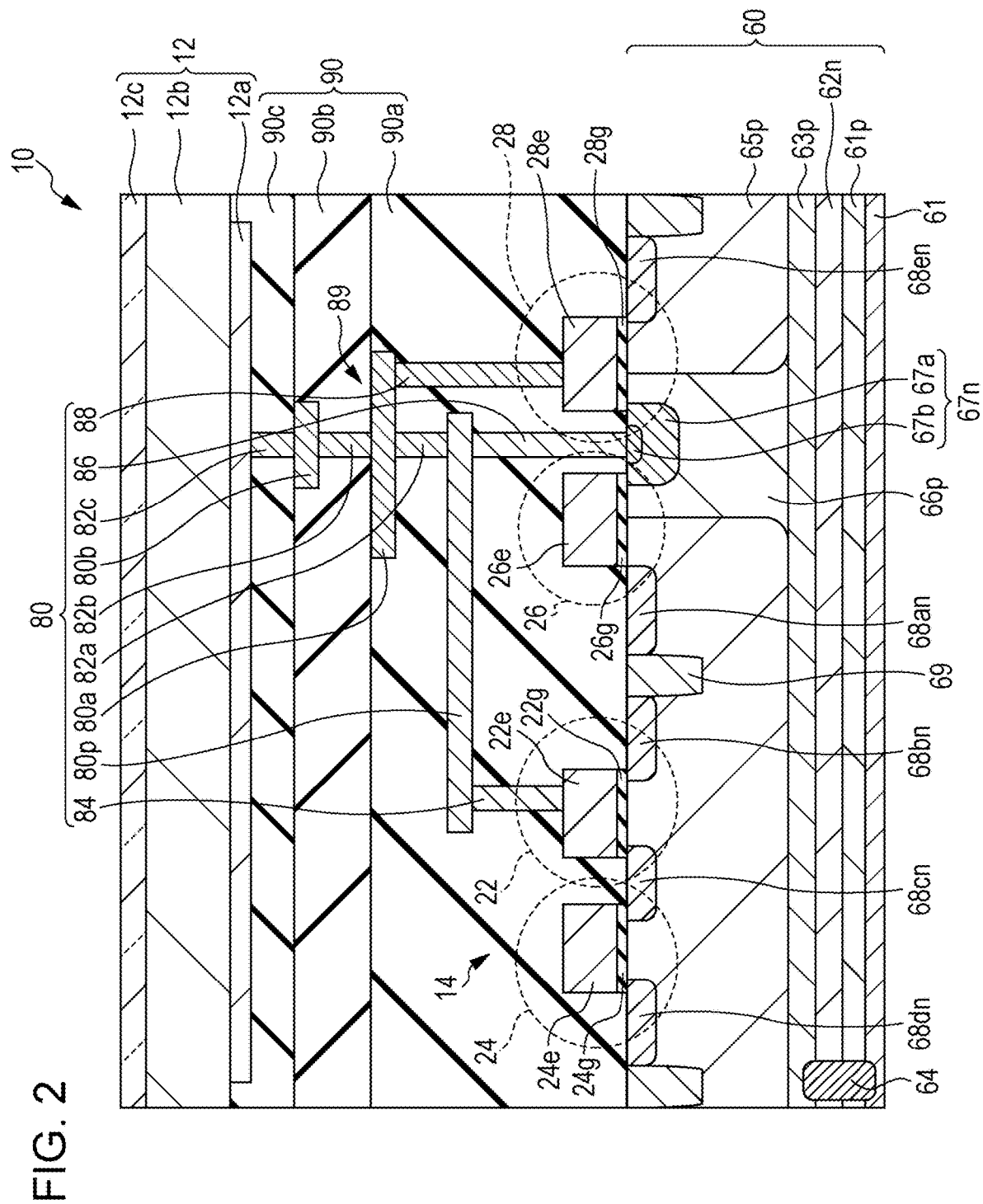
FIG. 2 is a schematic cross-sectional view depicting a typical example of the device structure of a unit pixel.

FIG. 2 depicts a typical example of the device structure of the unit pixel 10. As schematically depicted in FIG. 2, broadly speaking, the unit pixel 10 includes a semiconductor substrate 60, the photoelectric converter 12 arranged above the semiconductor substrate 60, and a wiring structure 80 arranged between the photoelectric converter 12 and the semiconductor substrate 60.

The amplification transistor 22, the address transistor 24, the reset transistor 26, and the protection transistor 28 in the aforementioned signal detection circuit 14 are formed on the semiconductor substrate 60. It should be noted that, in FIG. 2, the amplification transistor 22, the address transistor 24, the reset transistor 26, and the protection transistor 28 are depicted in one cross-sectional view for the convenience of the description. As described later, the semiconductor substrate 60 includes an n-type impurity region 67n that functions as part of the charge accumulation region.

In the present embodiment, the n-type impurity region 67n is an example of a first region. An n-type conductivity is an example of a first conductivity type. A p-type conductivity is an example of a second conductivity type that is the opposite conductivity type to the first conductivity type. In other words, the second conductivity type has a polarity that is different from the polarity of the first conductivity type. The n-type and p-type may be interchanged with each other.

In a case where the semiconductor substrate 60 is a silicon substrate, boron (B), aluminum (Al), gallium (Ga), indium (In), and the like are possible examples of an impurity having p-type conductivity. Boron is typically used as an impurity having p-type conductivity. Nitrogen (N), phosphorus (P), arsenic (As), antimony (Sb), and the like are possible examples of an impurity having n-type conductivity. Phosphorus or arsenic is typically used as an impurity having n-type conductivity. In the unit pixel 10, even if a plurality of portions have the same conductivity type as each other, those portions do not necessarily include the same impurity element. The conductivity types being the same does not necessarily mean that the impurity elements used are the same. The method for forming a local impurity region may be a thermal diffusion method or may be an ion implantation method. The conductivity type of the substrate and the layers can be controlled by means of impurities that are doped during crystal growth.

An interlayer insulating layer 90 that covers the transistors is arranged on the semiconductor substrate 60. The aforementioned wiring structure 80 is arranged in the interlayer insulating layer 90. In this example, the interlayer insulating layer 90 has a laminated structure that includes three insulating layers 90a, 90b, and 90c, and the wiring structure 80 in the interlayer insulating layer 90 includes wiring layers 80a, 80b, and 80p, plugs 82a, 82b, and 82c, and contact plugs 84, 86, and 88. The number of insulating layers in the interlayer insulating layer 90 and the number of wiring layers in the wiring structure 80 are not restricted to this example and can be arbitrarily set.

The wiring structure 80 electrically connects the photoelectric converter 12 and the n-type impurity region 67n of the semiconductor substrate 60. The wiring layers 80a and 80b in the wiring structure 80, the plugs 82a, 82b, and 82c, and the contact plug 88 are typically formed from a metal such as copper or tungsten or a metal compound such as a metal nitride or a metal oxide. However, here, the wiring layer 80p and the contact plugs 84 and 86 are respectively a polysilicon layer and polysilicon plugs having n-type conductivity.

The semiconductor substrate 60 includes a support substrate 61 and one or more semiconductor layers formed on the support substrate 61. Here, a p-type silicon (Si) substrate is given as an example of the support substrate 61. In the configuration exemplified in FIG. 2, the semiconductor substrate 60 has a p-type semiconductor layer 61p on the support substrate 61, an n-type semiconductor layer 62n on the p-type semiconductor layer 61p, a p-type semiconductor layer 63p on the n-type semiconductor layer 62n, and a p-type semiconductor layer 65p on the p-type semiconductor layer 63p. The p-type semiconductor layer 63p is formed across the entire surface of the support substrate 61. The p-type semiconductor layer 65p has a p-type impurity region 66p having a lower impurity concentration, n-type impurity regions 68an, 68bn, 68cn, 68dn, and 68en, and element isolation regions 69.

Each of the p-type semiconductor layer 61p, the n-type semiconductor layer 62n, the p-type semiconductor layer 63p, and the p-type semiconductor layer 65p are typically formed by means of epitaxial growth. The impurity concentrations in the p-type semiconductor layer 63p and the p-type semiconductor layer 65p are approximately the same as each other and are lower than the impurity concentration of the p-type semiconductor layer 61p. The n-type semiconductor layer 62n arranged between the p-type semiconductor layer 61p and the p-type semiconductor layer 63p suppresses the inflow of minority carriers from the support substrate 61 (may be said to be the p-type semiconductor layer 61p) or the peripheral circuits to the charge accumulation region that accumulates signal charge. During operation of the imaging device 100, the potential of the n-type semiconductor layer 62n is controlled via a well contact (not depicted) provided outside the pixel array PA. Furthermore, in this example, the semiconductor substrate 60 has a p-type region 64 provided between the p-type semiconductor layer 63p and the support substrate 61 in such a way as to pass through the p-type semiconductor layer 61p and the n-type semiconductor layer 62n. The p-type region 64 has a high impurity concentration compared to the p-type semiconductor layer 63p and the p-type semiconductor layer 65p, and electrically connects the p-type semiconductor layer 63p and the support substrate 61. During operation of the imaging device 100, the potentials of the p-type semiconductor layer 63p and the support substrate 61 are controlled via a substrate contact (not depicted) provided outside the pixel array PA.

The aforementioned n-type impurity region 67n is arranged within the p-type impurity region 66p formed within the p-type semiconductor layer 65p serving as a p-well. As schematically depicted in FIG. 2, the n-type impurity region 67n is formed in the vicinity of the surface of the semiconductor substrate 60, and at least part thereof is located on the surface of the semiconductor substrate 60. In the configuration exemplified in FIG. 2, the n-type impurity region 67n includes a first impurity region 67a and a second impurity region 67b. Part of the second impurity region 67b is located on the surface of the p-type semiconductor layer 65p. The first impurity region 67a covers the lower section of the second impurity region 67b. The second impurity region 67b in the n-type impurity region 67n is formed within the first impurity region 67a and has a higher impurity concentration than the first impurity region 67a.

In the configuration exemplified in FIG. 2, the contact plug 86 is connected to the second impurity region 67b formed in the semiconductor substrate 60. Although the formation of the second impurity region 67b in the n-type impurity region 67n is not essential, by making the impurity concentration of the second impurity region 67b, which is a connecting portion between the contact plug 86 and the semiconductor substrate 60, to be comparatively high, an effect is obtained in that spreading of a depletion layer (depletion) in the periphery of the portion where the contact plug 86 and the semiconductor substrate 60 make contact is suppressed. By suppressing spreading of a depletion layer in the periphery of the portion where the contact plug 86 and the semiconductor substrate 60 make contact, it is possible to suppress leakage current caused by a crystal defect (may be referred to as an interface state) of the semiconductor substrate 60 in the interface between the contact plug 86 and the semiconductor substrate 60. Furthermore, due to the contact plug 86 connecting to the second impurity region 67b having a comparatively high impurity concentration, the effect of reducing contact resistance is obtained.

Junction capacitance formed by a p-n junction between the p-type impurity region 66p and the n-type impurity region 67n functions as capacitance that accumulates at least some signal charge. This capacitance constitutes part of the charge accumulation region. In the configuration exemplified in FIG. 2, the first impurity region 67a having a lower impurity concentration than the second impurity region 67b is arranged between the second impurity region 67b of the n-type impurity region 67n and the p-type impurity region 66p. Furthermore, the first impurity region 67a is also located between the second impurity region 67b of the n-type impurity region 67n and the p-type semiconductor layer 65p. By arranging the first impurity region 67a, which has a relatively low impurity concentration, in the periphery of the second impurity region 67b, it is possible to lessen the strength of the electric field formed by the p-n junction between the n-type impurity region 67n and the p-type semiconductor layer 65p (or the p-type impurity region 66p). By lessening the strength of the electric field formed by the p-n junction, leakage current caused by the electric field formed by the p-n junction is suppressed.

By arranging the p-type semiconductor layer 65p so as to make contact with the p-type semiconductor layer 63p, it is possible to control the potential of the p-type semiconductor layer 65p via the p-type semiconductor layer 63p during operation of the imaging device 100. By adopting this kind of structure, it is possible to arrange regions having a relatively low impurity concentration (here, the p-type impurity region 66p and the first impurity region 67a of the n-type impurity region 67n) in the periphery of the portion where the contact plug 86 and the semiconductor substrate 60 make contact (here, the second impurity region 67b of the n-type impurity region 67n).

The n-type impurity region 67n formed within the p-type impurity region 66p functions as the drain of the reset transistor 26. In this example, the reset transistor 26 includes at least part of the n-type impurity region 67n as a drain, and further includes a gate insulation layer 26g on the semiconductor substrate 60, a gate electrode 26e on the gate insulation layer 26g, and the n-type impurity region 68an. As schematically depicted in FIG. 2, when seen from a direction normal to the semiconductor substrate 60, the laminated structure of the gate insulation layer 26g and the gate electrode 26e overlaps at least part of the n-type impurity region 67n. The gate electrode 26e of the reset transistor 26 is typically a polysilicon electrode having n-type conductivity.

The reset transistor 26 is an example of a first transistor that includes the n-type impurity region 68an as a first source and includes the n-type impurity region 67n as a first drain. The gate electrode 26e of the reset transistor 26 is an example of a first gate.

In the configuration exemplified in FIG. 2, the n-type impurity region 67n serving as a drain is electrically connected to the photoelectric converter 12 via the contact plug 86, the wiring layer 80p, the plug 82a, the wiring layer 80a, the plug 82b, the wiring layer 80b, and the plug 82c. Meanwhile, the n-type impurity region 68an is connected to the aforementioned feedback line 53 via an undepicted contact plug, and functions as the source of the reset transistor 26. The reset transistor 26 turning on causes a reset voltage (here, the voltage of the feedback line 53) for initializing the photoelectric converter 12 to be supplied to the photoelectric converter 12 via the n-type impurity region 68an. Here, a gate electrode 22e of the amplification transistor 22 is connected to the n-type impurity region 67n via the contact plug 86, the wiring layer 80p, and the contact plug 84. Therefore, the reset transistor 26 turning on causes the charge accumulated in the charge accumulation region to be reset and also the potential of the gate electrode 22e of the amplification transistor 22 to be reset to the reset voltage.

In this example, the n-type impurity region 67n is shared also by the protection transistor 28, and also functions as the drain (or the source) of the protection transistor 28. The protection transistor 28 includes at least part of the n-type impurity region 67n, a gate insulation layer 28g on the semiconductor substrate 60, a gate electrode 28e on the gate insulation layer 28g, and the n-type impurity region 68en. When seen from a direction normal to the semiconductor substrate 60, the laminated structure of the gate insulation layer 28g and the gate electrode 28e overlaps at least part of the n-type impurity region 67n. The n-type impurity region 68en is connected to the aforementioned charge recovery line 38 via an undepicted contact plug. The n-type impurity region 68en functions as the source (or the drain) of the protection transistor 28. During operation of the imaging device 100, a predetermined voltage (typically a lower voltage than the power source voltage VDD) is applied to the n-type impurity region 68en via the charge recovery line 38.

The gate electrode 28e of the protection transistor 28 and the n-type impurity region 67n serving as the drain (or the source) of the protection transistor 28 are electrically connected via a connecting section 89. Here, the connecting section 89 includes the contact plug 88 having one end connected to the gate electrode 28e of the protection transistor 28, and includes the wiring layer 80a, the plug 82a, the wiring layer 80p, and the contact plug 86. In other words, here, the connecting section 89 includes part of the wiring structure 80, and consequently the gate electrode 28e of the protection transistor 28 has an electrical connection with the photoelectric converter 12. When light is radiated at a high illuminance on the photoelectric converter 12, and the voltage of the charge accumulation region rises and exceeds a threshold voltage of the protection transistor 28, the protection transistor 28 turns on. The protection transistor 28 turning on causes excess charge to be discharged from the n-type impurity region 67n to the n-type impurity region 68en.

The protection transistor 28 is an example of a second transistor that includes the n-type impurity region 67n as a second drain and includes the n-type impurity region 68en as a second source. The gate electrode 28e of the protection transistor 28 is an example of a second gate electrically connected to the n-type impurity region 67n.

In the embodiment of the present disclosure, the gate electrode 28e of the protection transistor 28 is formed as a polysilicon electrode having a conductivity type that is different from that of the n-type impurity region 67n. In other words, here, the gate electrode 28e is a polysilicon electrode having p-type conductivity, and the conductivity type of the gate electrode 28e of the protection transistor 28 is different from the conductivity type of the gate electrode 26e of the reset transistor 26. As described in detail later, by using an electrode having a conductivity type that is different from the conductivity type of the drain (or the source) as the gate electrode 28e of the protection transistor 28, the protection transistor 28 when off can be made to have an accumulation mode. In other words, it is possible to realize a state that is substantially similar to when a negative voltage is applied to the gate electrode 28e of the protection transistor 28. As described later, due to the protection transistor 28 being made to have an accumulation mode, it is possible to reduce dark current that is present when the protection transistor 28 is off.

In a general imaging device, the conductivity type of the sources/drains of transistors within pixels and the conductivity type of polysilicon electrodes serving as gate electrodes of those transistors are ordinarily the same. Furthermore, it is general practice for the conductivity type of gate electrodes to be common among the plurality of transistors within pixels in order to avoid the manufacturing process becoming complex. In the embodiment of the present disclosure, the conductivity type of the gate electrodes in some transistors (here, the protection transistor 28) within pixels is deliberately made to be different from the conductivity type of the gate electrodes in the other electrodes, and the effect of reducing dark current is thereby obtained.

It should be noted that, in this example, the contact plug 86 connected to the n-type impurity region 67n and the contact plug 88 connected to the gate electrode 28e of the protection transistor 28 are electrically connected via the wiring layer 80a formed as a metal wiring layer. Furthermore, in this example, the contact plug 88 is formed of a metal. With a connection implemented by means of a metal or a metal compound in this way, it is possible for two members having mutually different conductivity types to be electrically joined while avoiding direct contact therebetween. For example, if the contact plug 88 is a polysilicon plug having n-type conductivity, the junction between the contact plug 88 and the gate electrode 28e becomes non-ohmic. As in the configuration exemplified here, with a connection implemented by means of a metal or a metal compound, an ohmic connection between the contact plug 88 and the gate electrode 28e is possible. Alternatively, the contact plug 88 may be formed of a polysilicon having the same conductivity type as that of the gate electrode 28e (here, p-type). In this case, the junction between the contact plug 88 and the wiring layer 80a can be made to be ohmic.

In the configuration exemplified in FIG. 2, the amplification transistor 22 includes a gate insulation layer 22g on the semiconductor substrate 60, the gate electrode 22e on the gate insulation layer 22g, and the n-type impurity regions 68bn and 68cn formed in the semiconductor substrate 60. Here, similar to the gate electrode 26e of the reset transistor 26, the gate electrode 22e is a polysilicon electrode having n-type conductivity. In the configuration exemplified in FIG. 2, the gate electrode 22e is electrically connected to the photoelectric converter 12 via the contact plug 84, the wiring layer 80p, the plug 82a, the wiring layer 80a, the plug 82b, the wiring layer 80b, and the plug 82c. The n-type impurity region 68bn has a connection with the power source wiring 32 (not depicted in FIG. 2) and functions as the drain of the amplification transistor 22. Meanwhile, the n-type impurity region 68cn functions as the source of the amplification transistor 22.

An element isolation region 69 is provided between the n-type impurity region 68bn serving as the drain of the amplification transistor 22 and the n-type impurity region 68cn serving as the source of the reset transistor 26. The element isolation region 69 is provided in the periphery of sets of the amplification transistor 22 and the address transistor 24, and in the periphery of sets of the reset transistor 26 and the protection transistor 28. The element isolation regions 69 electrically isolate the signal detection circuit 14 of a unit pixel 10 and the signal detection circuits 14 of other unit pixels 10. The element isolation regions 69 are p-type impurity diffusion regions, for example.

Although not depicted in FIG. 2, typically, a contact plug that electrically connects the n-type impurity region 68bn and the power source wiring 32 is arranged therebetween. The power source wiring 32 typically extends in the column direction. By forming the power source wiring 32 so as to extend in the column direction, a voltage drop in the power source wiring 32 can be reduced compared to the case where the power source wiring 32 is formed so as to extend in the row direction. This is because, if the power source wiring 32 is formed so as to extend in the row direction in order to adopt row units for the selection of unit pixels 10 when performing signal reading, a large current required to drive all unit pixels 10 in one row has to be supplied to one power source wiring 32 line. If the power source wiring 32 is formed so as to extend in the column direction, it is sufficient for the size of the current supplied to a power source wiring 32 line to be the size required to drive one unit pixel 10 in a row selected from among the plurality of rows. It should be noted that, in the present specification, the row direction means the direction in which rows extend, and the column direction means the direction in which columns extend. For example, in FIG. 1, the vertical direction in the page space is the column direction, and the horizontal direction in the page space is the row direction.

The address transistor 24 includes a gate insulation layer 24g on the semiconductor substrate 60, a gate electrode 24e on the gate insulation layer 24g, and the n-type impurity regions 68cn and 68dn formed in the semiconductor substrate 60. In this example, the address transistor 24 shares the n-type impurity region 68cn with the amplification transistor 22, and is thereby electrically connected to the amplification transistor 22. It should be noted that the gate insulation layer 22g of the amplification transistor 22, the gate insulation layer 24g of the address transistor 24, the gate insulation layer 26g of the reset transistor 26, and the gate insulation layer 28g of the protection transistor 28 are typically thermal oxide films of silicon (silicon dioxide) in the same layer.

The n-type impurity region 68cn functions as a drain of the address transistor 24. Meanwhile, the n-type impurity region 68dn functions as the source of the address transistor 24. The n-type impurity region 68dn has a connection with the vertical signal line 35 (not depicted in FIG. 2). Although not depicted in FIG. 2, typically, a contact plug that electrically connects the n-type impurity region 68dn and the vertical signal line 35 is arranged therebetween.

The photoelectric converter 12 is arranged on the interlayer insulating layer 90 that covers the amplification transistor 22, the address transistor 24, the reset transistor 26, and the protection transistor 28. The photoelectric converter 12 includes a pixel electrode 12a formed on the interlayer insulating layer 90, a transparent electrode 12c opposing the pixel electrode 12a, and a photoelectric conversion layer 12b arranged therebetween. The photoelectric conversion layer 12b of the photoelectric converter 12 is formed from an organic material or an inorganic material such as amorphous silicon, receives light that is incident through the transparent electrode 12c, and generates positive and negative charge by means of photoelectric conversion. The photoelectric conversion layer 12b is typically formed across the plurality of unit pixels 10. The photoelectric conversion layer 12b may include a layer configured from an organic material and a layer configured from an inorganic material.

The transparent electrode 12c is formed from a transparent electrically conductive material such as ITO and is arranged at the light-receiving surface side of the photoelectric conversion layer 12b. Similar to the photoelectric conversion layer 12b, the transparent electrode 12c is typically formed across the plurality of unit pixels 10. Although not depicted in FIG. 2, the transparent electrode 12c has a connection with the aforementioned accumulation control line 39, and, during operation of the imaging device 100, a bias voltage of approximately 10 V, for example, is applied to the transparent electrode 12c via the accumulation control line 39. By making the potential of the transparent electrode 12c be higher than the potential of the pixel electrode 12a by means of the bias voltage, it is possible for positive charge (for example, positive holes) serving as signal charge and generated by means of photoelectric conversion to be collected by the pixel electrode 12a.

The pixel electrode 12a is an electrode formed from a metal such as aluminum, copper, or titanium, a metal nitride, polysilicon imparted with conductivity due to being doped with an impurity, or the like. The pixel electrode 12a is spatially separated from the pixel electrodes 12a of other adjacent unit pixels 10, and is thereby electrically isolated from the pixel electrodes 12a of other unit pixels 10.

At least part of the aforementioned wiring structure 80 electrically connects the pixel electrode 12a and the signal detection circuit 14 formed in the semiconductor substrate 60. In this example, the pixel electrode 12a and the gate electrode 22e of the amplification transistor 22 are electrically connected to each other via the plug 82c, the wiring layer 80b, the plug 82b, the wiring layer 80a, the plug 82a, the wiring layer 80p, and the contact plug 84. Consequently, during operation of the imaging device 100, a signal voltage that corresponds to the potential of the pixel electrode 12a is output from the amplification transistor 22. Furthermore, in this example, the pixel electrode 12a and n-type impurity region 67n are electrically connected to each other via the plug 82c, the wiring layer 80b, the plug 82b, the wiring layer 80a, the plug 82a, the wiring layer 80p, and the contact plug 86. The wiring layers 80a, 80b, and 80p, the plugs 82a, 82b, and 82c, the contact plugs 84, 86, and 88, the gate electrode 22e of the amplification transistor 22, the gate electrode 28e of the protection transistor 28, and the n-type impurity region 67n constitute at least part of the charge accumulation region that accumulates signal charge.

As mentioned above, in the example depicted in FIG. 2, the protection transistor 28 and the reset transistor 26 share the n-type impurity region 67n. It is not essential for the protection transistor 28 and the reset transistor 26 to share the n-type impurity region 67n. For example, another n-type impurity region electrically connected to the n-type impurity region 67n may be formed in another location of the semiconductor substrate 60, and that n-type impurity region may be used as the drain (or the source) of the protection transistor 28 or the reset transistor 26. However, sharing the n-type impurity region 67n is more advantageous from the viewpoint of miniaturizing the unit pixels 10 and suppressing dark current.

(Typical Example of Function and Configuration of Protection Transistor)

If light having an extremely high illuminance is radiated onto the photoelectric converter 12, the potential of the n-type impurity region 67n serving as the charge accumulation region may rise to the voltage applied to the transparent electrode 12c (approximately 10 V, for example). If this kind of excessive voltage is applied to the n-type impurity region 67n, there is a risk of the function of the n-type impurity region 67n being impaired and a dielectric breakdown occurring in the gate insulation layer 22g of the amplification transistor 22. If this kind of damage occurs, the functions of the pixels are impaired and the imaging device malfunctions.

By providing the protection transistor 28, which includes the n-type impurity region 67n as the drain (or the source), within the unit pixels 10 as depicted in FIGS. 1 and 2, it is possible to suppress damage to the unit pixels 10 caused by the application of an excessive voltage to the n-type impurity region 67n. For example, we shall assume that the potential of the n-type impurity region 67n has risen and exceeded the threshold voltage of the protection transistor 28 due to the radiation of light onto the photoelectric converter 12 at a high illuminance. As is apparent from FIG. 2, the gate electrode 28e of the protection transistor 28 is electrically connected to the n-type impurity region 67n by means of the connecting section 89. Therefore, due to an increase in the potential of the n-type impurity region 67n, the protection transistor 28 turns on. The protection transistor 28 turning on causes excess charge to be discharged from the n-type impurity region 67n to the n-type impurity region 68en, and therefore damage to the unit pixel 10 is prevented. It is sufficient for the threshold voltage in the protection transistor 28 to be appropriately set to be lower than a voltage at which there occurs loss of the function in the n-type impurity region 67n, dielectric breakdown in the gate insulation layer 22g of the amplification transistor 22, or the like.

By providing the protection transistor 28 within the unit pixels 10 in this way, it is possible to prevent damage to the unit pixels 10.

As mentioned above, in the embodiment of the present disclosure, the gate electrode 28e of the protection transistor 28 has a conductivity type that is different from the conductivity type of the drain (or the source) of the protection transistor 28. In contrast, in a general transistor, the conductivity type of a polysilicon electrode serving as the gate electrode and the conductivity type of the source/drain are the same. To turn off this kind of transistor, the transistor is set to accumulation mode or the portion below the gate electrode of the transistor is depleted. For example, in an N-channel MOSFET, the region below that gate electrode can be set to accumulation mode if the voltage applied to the gate electrode is set to be lower than the threshold voltage of that transistor. However, with a protection transistor that is used with the drain being connected to the gate, the desired voltage cannot be applied to the gate electrode from outside. In other words, it is not possible to set the accumulation mode by applying the desired voltage to the gate electrode. Meanwhile, if a depletion layer is formed below the gate electrode, the depletion layer below the gate electrode becomes a cause for the generation of dark current. Consequently, from the viewpoint of suppressing dark current, it is beneficial in that the protection transistor can be set to accumulation mode without it being necessary for a voltage to be applied from outside. It should be noted that, in the configuration exemplified in FIG. 2, the reset transistor 26 also includes the n-type impurity region 67*n* as the drain (or the source). Consequently, there is also a benefit for the reset transistor 26 in that it is possible to suppress the formation of a depletion layer below the gate electrode 26*e* when the reset transistor 26 is off.

For example, in a case where a polysilicon electrode having n-type conductivity is used as the gate electrode, if the gate voltage is reduced to approximately −0.5 V, the depletion layer below the gate electrode is more or less eliminated. In the embodiment of the present disclosure, during operation of the imaging device 100, the vertical scanning circuit 46 (see FIG. 1) supplies a negative voltage of approximately −1 V, for example, to the reset signal line 36 as a voltage for turning off the reset transistor 26. By using a negative voltage as the gate voltage for when the reset transistor 26 is off, it is possible to suppress the formation of a depletion layer below the gate electrode 26*e* and reduce dark current caused by a depletion layer below the gate electrode 26*e*.

Similarly, if a negative voltage is used as the gate voltage for when the protection transistor 28 is off, it is feasible to it to be possible to suppress the formation of a depletion layer below the gate electrode 28*e* of the protection transistor 28. However, as already explained, the gate electrode 28*e* of the protection transistor 28 is electrically connected via the connecting section 89 to the n-type impurity region 67*n* serving as the drain (or the source) (see FIG. 2). Therefore, the gate electrode 28*e* has the same potential as the n-type impurity region 67*n*, and a negative voltage cannot simply be used as the gate voltage for when the protection transistor 28 is off.

As described with reference to FIG. 2, in the embodiment of the present disclosure, a polysilicon electrode having a conductivity type that is different from the conductivity type of the n-type impurity region 67*n* is used for the gate electrode 28*e* of the protection transistor 28. It is thereby possible to increase the work function of the gate electrode 28*e* compared to a case where a polysilicon electrode having n-type conductivity is used. In addition, the work function in a polysilicon electrode can be adjusted by means of the impurity doping amount, and it is possible to obtain a value that is greater than the work function in the region of the semiconductor substrate 60 below the gate electrode 28*e*, as the work function in the polysilicon electrode. By setting the work function in the polysilicon electrode to be greater than the work function in the semiconductor substrate 60 (here, the p-type impurity region 66*p* and the p-type semiconductor layer 65*p*), an energy band diagram similar to that of the accumulation mode is obtained as an energy band diagram in the vicinity of the gate electrode 28*e* of the protection transistor 28. In other words, it is possible to realize a state that is similar to that of the accumulation mode without applying a specific voltage to the gate electrode 28*e* from outside the gate electrode 28*e*. Consequently, positive holes can be attracted to below the gate electrode 28*e* and the width of a depletion layer below the gate electrode can be made to be more or less 0. Alternatively, a state that is similar to that of the accumulation mode may be realized by increasing the work function in the polysilicon electrode so that the threshold voltage in the protection transistor 28 rises.

It should be noted that a material having a work function of the same level as that of polysilicon having p-type conductivity may be used as the gate electrode 28*e* of the protection transistor 28. Here, the work function of P$^+$ polysilicon is 5.17 eV. Consequently, for example, RuO$_2$ (4.9 eV), WN (5.0 eV), Ir (5.35 eV), Mo$_2$N (5.33 eV), TaN (5.43 eV), or Pt (5.65 eV) may be used as the gate electrode 28*e*. Furthermore, a constant effect can be obtained with a material having a work function that is greater than that of N$^+$ polysilicon (4.05 eV). In other words, a so-called midgap metal may be used such as Co (4.45 eV), Cr (4.5 eV), W (4.52 eV), Ru (4.68 eV), TiN (4.7 eV), or Pd (4.9 eV). The work function of the material of the gate electrode 28*e* may be greater than 4.05 eV or may be in the range from 4.9 eV to 6 eV. By using this kind of material, it is possible to obtain the effect of reducing leakage current.

Furthermore, a high dielectric constant (high-k) material such as HfO$_2$ can be used for a gate oxide film, for example.

In addition, in the example described with reference to FIGS. 1 and 2, the imaging device 100 is configured for it to be possible to apply a voltage that is different from the power source voltage VDD to the n-type impurity region 68*en* serving as the source (or the drain) of the protection transistor 28. As described hereinafter, it is possible to realize a more stable operation in the protection transistor 28 by supplying a voltage that is lower than the power source voltage VDD, for example, to the n-type impurity region 68*en* during operation of the imaging device 100.

In the present embodiment, in order to reduce dark current that is present when the protection transistor 28 is off, the gate electrode 28*e* of the protection transistor 28 is configured of a material having p-type conductivity. In addition, the configuration described hereinafter is adopted in the imaging device 100 of the present embodiment.

Figure 3:
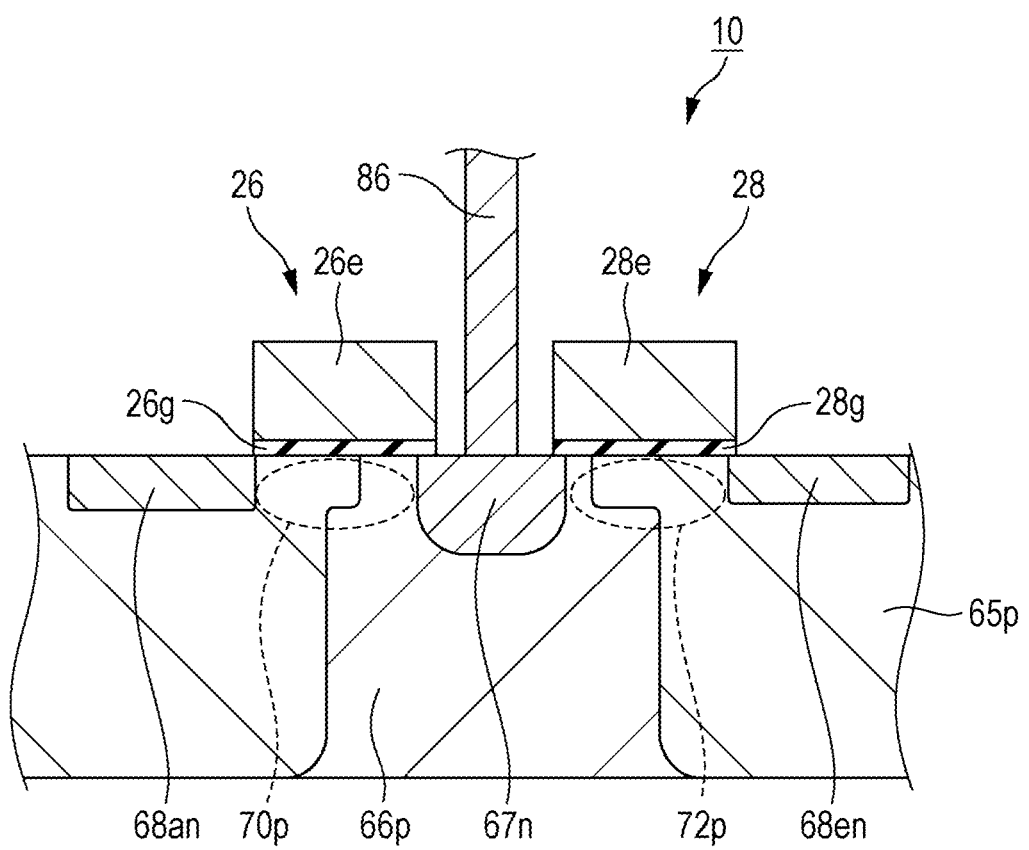
FIG. 3 is a schematic cross-sectional view depicting part of the structure of the unit pixel in detail.

FIG. 3 depicts part of the structure of the unit pixel 10 in detail. The unit pixel 10 has a second region 70*p* located below the gate electrode 26*e* of the reset transistor 26. The second region 70*p* is a channel region of the reset transistor 26 and has p-type conductivity. The unit pixel 10 additionally has a third region 72*p* located below the gate electrode 28*e* of the protection transistor 28. The third region 72*p* is a channel region of the protection transistor 28 and has p-type conductivity. The concentration of a p-type impurity in the third region 72*p* is higher than the concentration of the p-type impurity in second region 70*p*. In a case where the semiconductor substrate 60 is a silicon substrate, the p-type impurity is at least one selected from the group consisting of boron, aluminum, gallium, and indium. The p-type impurity is typically boron. It should be noted that FIG. 3 accurately depicts that an impurity is implanted in the region below the gate electrode 26e of the reset transistor 26 and the region below the gate electrode 28e of the protection transistor 28.

If it is possible to suppress the spreading of a depletion layer that accompanies a rise in the voltage of the charge accumulation region including the n-type impurity region 67n, it is possible to reduce surface leakage current, and it is possible to reduce dark current produced when charge has been accumulated in the charge accumulation region. It is possible to suppress the spreading of the depletion layer by increasing the impurity concentration in the region below the gate electrode 28e of the protection transistor 28.

Generally, if the impurity concentration of a channel region of an FET is too high, the electric fields at the p-n junction between the gate and source and the p-n junction between the gate and drain intensify, which leads to an increase in diffusion current caused by minority carriers.

When focusing on the present embodiment, the reset transistor 26 can be operated in accumulation mode by applying a predetermined voltage to the gate electrode 26e of the reset transistor 26. Therefore, it is not necessary to increase the impurity concentration in the second region 70p below the gate electrode 26e of the reset transistor 26. In contrast, the protection transistor 28 is electrically connected to the charge accumulation region and therefore the protection transistor 28 cannot be operated in accumulation mode by applying a predetermined voltage to the gate electrode 28e of the protection transistor 28. Meanwhile, there is also a risk of diffusion current increasing if the impurity concentration of the third region 72p below the gate electrode 28e is increased. However, the main cause for dark current is surface leakage current caused by spreading of the depletion layer, and therefore, if it is possible to reduce surface leakage current, it is possible to reduce the total dark current even if there is a slight increase in diffusion current. For such reasons, in the present embodiment, an impurity is doped at a high concentration in the channel region of the protection transistor 28.

The concentration of the impurity in the second region 70p and the concentration of the impurity in the third region 72p can be controlled by means of the impurity implantation dose amount used when each region is formed, for example.

In the present embodiment, the p-type impurity included in the third region 72p is the same type of element as the p-type impurity in the second region 70p. The p-type impurity is typically boron. The second region 70p and the third region 72p may substantially include only boron as the p-type impurity. According to this kind of configuration, it is easy to manufacture the imaging device 100 and it is also easy to control the impurity concentration. The expression "substantially include only boron" means that boron is the only impurity that is intentionally doped and does not exclude unavoidable impurities being included in each region.

It should be noted that the element or element group for the p-type impurity included in the third region 72p may be different from the element or element group for the p-type impurity in the second region 70p.

The second region 70p is a region below the gate electrode 26e of the reset transistor 26. The second region 70p may have a p-type impurity concentration that is higher than that of the surrounding region, or may have a p-type impurity concentration that is the same as that of the surrounding region. That is, the addition of impurity doping to a channel region of the reset transistor 26 may be carried out or may not be carried out.

In FIG. 3, the third region 72p is separated from the n-type impurity region 67n. However, the distance between the third region 72p and the n-type impurity region 67n is short, and therefore an impurity implanted in the p-type semiconductor layer 65p to form the third region 72p may diffuse to the n-type impurity region 67n. That is, the third region 72p may be in contact with the n-type impurity region 67n.

The effect obtained by doping an impurity in the third region 72p that is the region below the gate electrode 28e of the protection transistor 28 was confirmed by means of a computer simulation. Specifically, boron concentration profiles for the second region 70p and the third region 72p obtained when a unit pixel 10 was made according to predetermined design conditions were investigated by means of a computer simulation. Thereafter, the distribution of a depletion layer in the vicinity of the n-type impurity region 67n serving as the charge accumulation region was investigated by means of a computer simulation for the unit pixel 10. Commercially available simulations were used for the computer simulations.

Figure 4A:
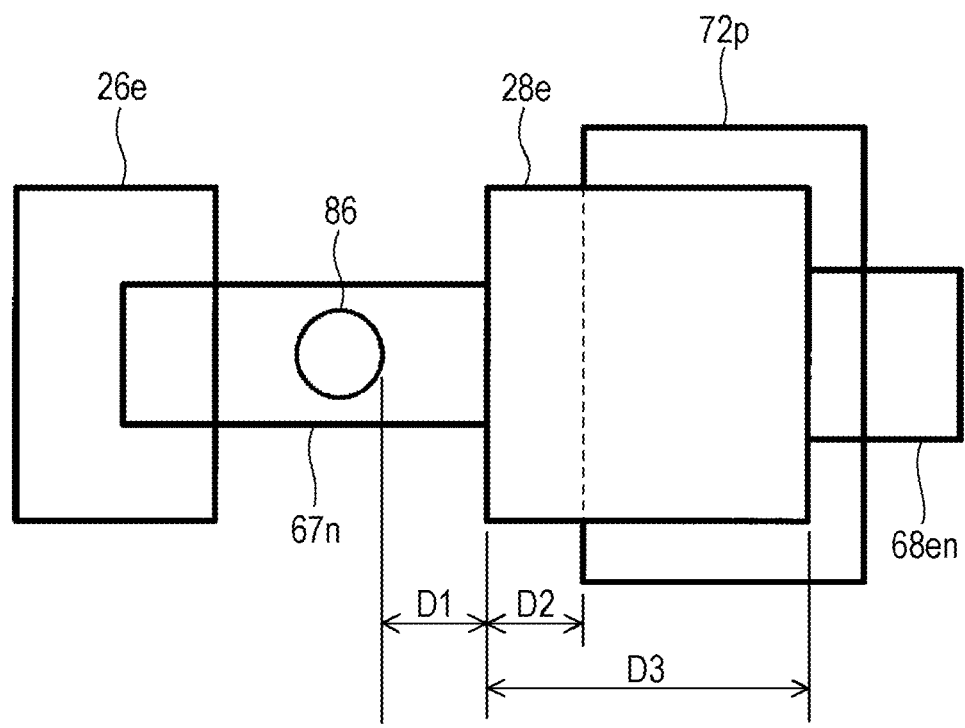
FIG. 4A is a model used in a simulation, and is a plan view depicting the positional relationship between the gate electrode of a reset transistor, an n-type impurity region, the gate electrode of a protection transistor, and a third region.

FIG. 4A is a model used in a simulation, and depicts a plan view of the positional relationship between the gate electrode 26e of the reset transistor 26, the n-type impurity region 67n, the gate electrode 28e of the protection transistor 28, and the third region 72p. In the model of FIG. 4A, a distance D1 between the contact plug 86 and the gate electrode 28e is 90 nm. A distance D2 between the n-type impurity region 67n and the third region 72p is 60 nm. The plan view shape of the gate electrode 28e is a square shape in which the length D3 of one side is 440 nm. One side of the gate electrode 28e is located at an end section of the n-type impurity region 67n. The third region 72p extends outside the gate electrode 28e. Part of the third region 72p overlaps the n-type impurity region 68en. According to this kind of configuration, it is possible to sufficiently suppress the depletion layer spreading to below the gate electrode 28e.

In FIG. 4A, the third region 72p is depicted as a rectangular region. This rectangular region indicates the designed location of a mask that is used when an impurity is implanted. The third region 72p has a p-type impurity concentration of a predetermined concentration or higher. The distance D2 may be in the range from 0 nm to 150 nm, or may be in the range from 20 nm to 120 nm, for example. The distance D2 is the shortest distance between the n-type impurity region 67n and the third region 72p.

Figure 5A:
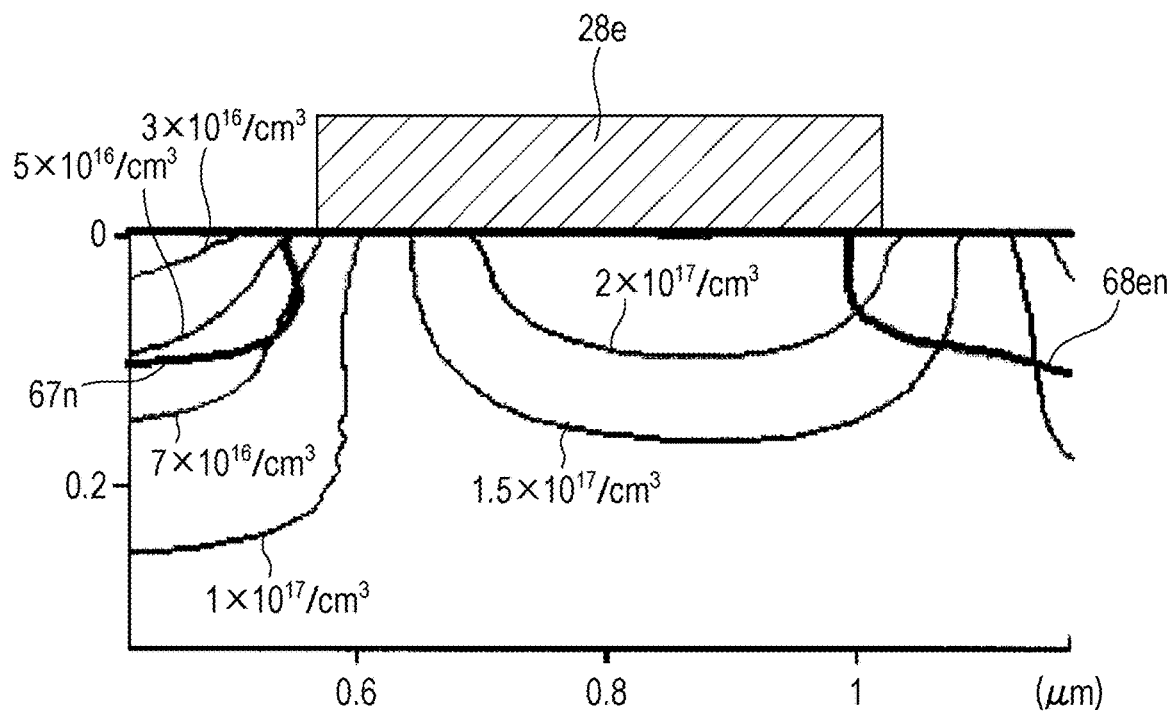
FIG. 5A is a contour diagram depicting the concentration distribution of an acceptor in the model of FIG. 4A.

FIG. 5A depicts the concentration distribution of an impurity in the model of FIG. 4A. To be specific, the impurity is boron. The dose amount of the impurity implanted in the third region 72p was $4 \times 10^{12}$ atoms/cm$^2$. In FIG. 5A, the horizontal axis represents the distance in the direction along the surface of the semiconductor substrate 60. The vertical axis represents the distance in the thickness direction of the semiconductor substrate 60. As depicted in FIG. 5A, a region including boron was present at a concentration of $1.5 \times 10^{17}$ atoms/cm$^3$ or higher below the gate electrode 28e.

Figure 6:
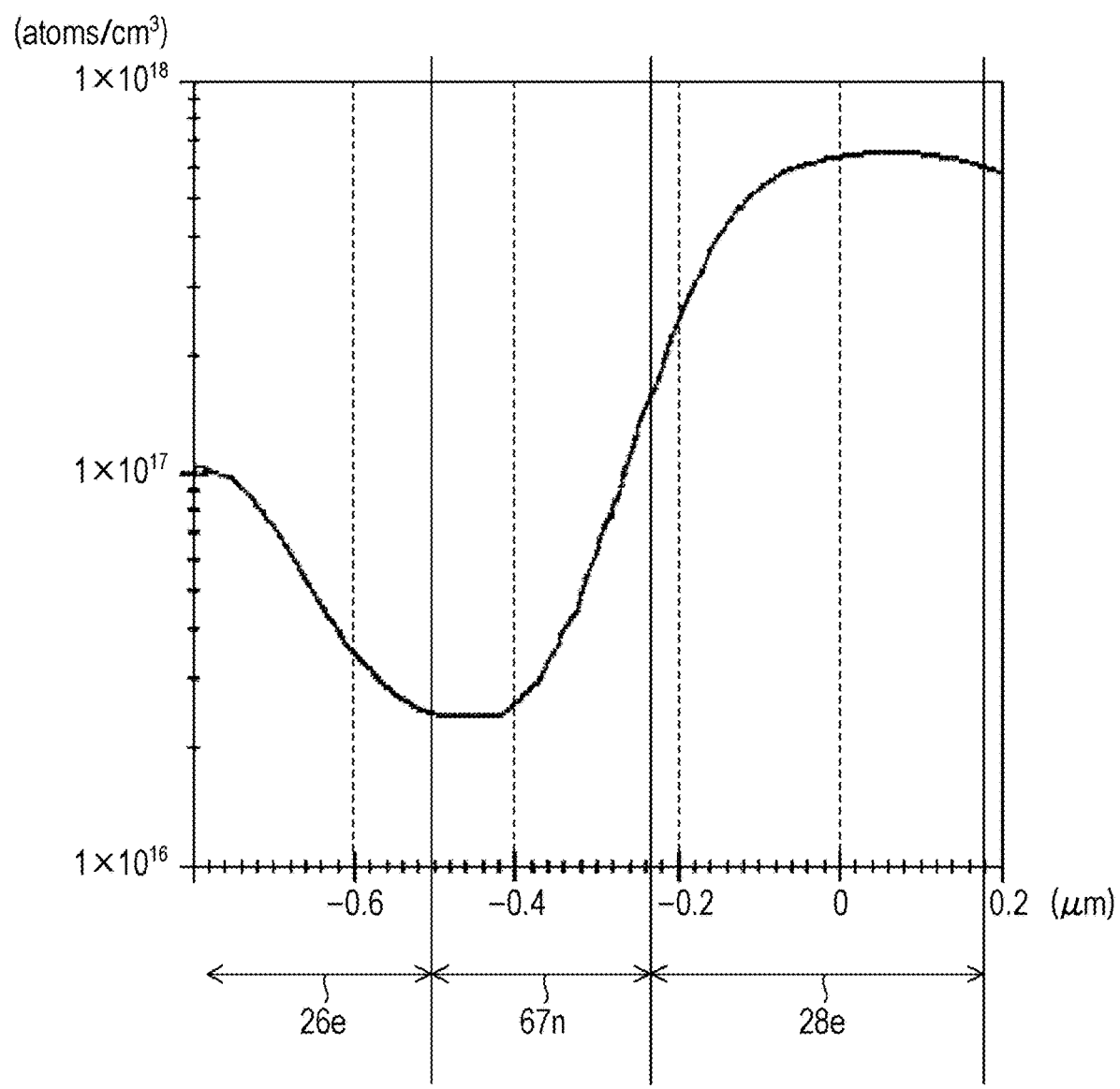
FIG. 6 is a graph depicting a concentration profile for boron in the vicinity of the surface of a semiconductor substrate in the model of FIG. 4A.

FIG. 6 depicts a concentration profile for boron in the vicinity of the surface of the semiconductor substrate 60 in the model of FIG. 4A. The horizontal axis of FIG. 6 represents the distance from the center of the gate electrode 28e of the protection transistor 28. The vertical axis represents the concentration of boron. As depicted in FIG. 6, the concentration of boron in the second region 70p below the gate electrode 26e of the reset transistor 26 was higher than the concentration of boron in the n-type impurity region 67n. The concentration of boron in the third region 72p below the gate electrode 28e of the protection transistor 28, overall, was higher than the concentration of boron in the second region 70p below the gate electrode 26e of the reset transistor 26. To be specific, the largest value $C_{OF}$ for the concentration of boron in the third region 72p was greater than the largest value $C_{RS}$ for the concentration of boron in the second region 70p. The largest value $C_{RS}$ for the concentration of boron in the second region 70p was approximately $1 \times 10^{17}$ atoms/cm$^3$. In this example, boron is also implanted in the second region 70p so as to exceed the concentration of boron in the n-type impurity region 67n.

The magnitude relationship between the concentration of the p-type impurity in the second region 70p and the concentration of the p-type impurity in the third region 72p may be determined using the largest value for the concentration in each region or may be determined using an average value for the concentration obtained at an arbitrary plurality of measurement points. For example, the concentration of an impurity having a second conductivity type at a location, separated by a predetermined distance from the n-type impurity region 67n, in the third region 72p may be higher than the concentration of an impurity having the second conductivity type at a location, separated by the same predetermined distance from the n-type impurity region 67n, in the second region 70p. Furthermore, the concentration of an impurity having the second conductivity type at a location, adjacent to the n-type impurity region 67n and below the gate electrode 28e, in the third region 72p may be higher than the concentration of an impurity having the second conductivity type at a location, adjacent to the n-type impurity region 67n and below the gate electrode 26e, in the second region 70p.

Figure 7A:
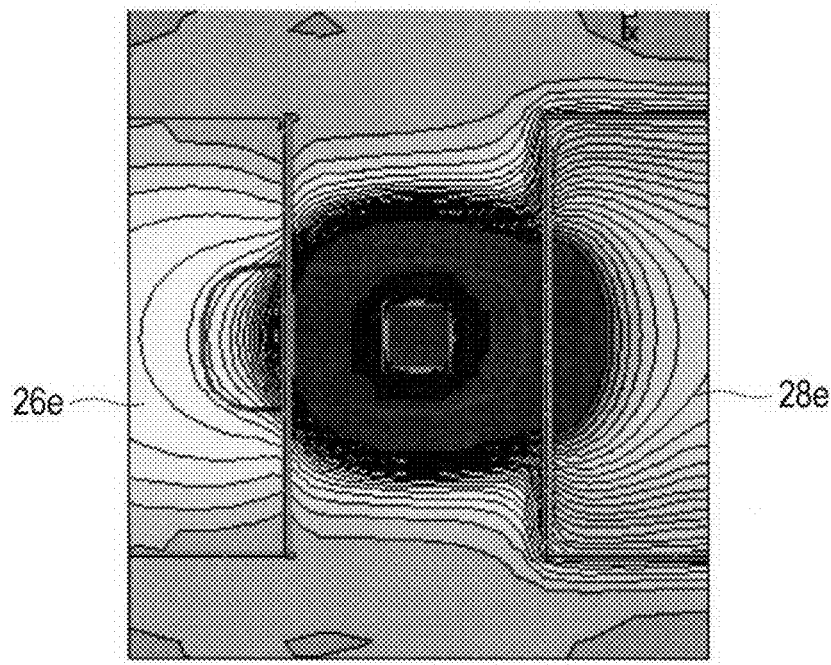
FIG. 7A is a contour diagram depicting the result of a simulation for investigating the distribution of a depletion layer in the configuration of the present disclosure.

FIG. 7A depicts the result of a simulation for investigating the distribution of a depletion layer in the configuration of the present disclosure. FIG. 7A corresponds to FIGS. 4A, 5A, and 6. The concentrated circular portion in the center of FIG. 7A represents a depletion layer having a low carrier concentration. In the simulation, the voltage of the gate electrode 26e of the reset transistor 26 was −1 V. The voltage of the n-type impurity region 67n, namely the voltage of the gate electrode 28e of the protection transistor 28, was +0.5 V. As depicted in FIG. 7A, according to the configuration of the present disclosure, the depletion layer spreading to below the gate electrode 28e of the protection transistor 28 was suppressed.

Although the concentration of boron in the second region 70p below the gate electrode 26e of the reset transistor 26 was kept low, spreading of the depletion layer to below the gate electrode 26e was not seen.

Figure 7B:
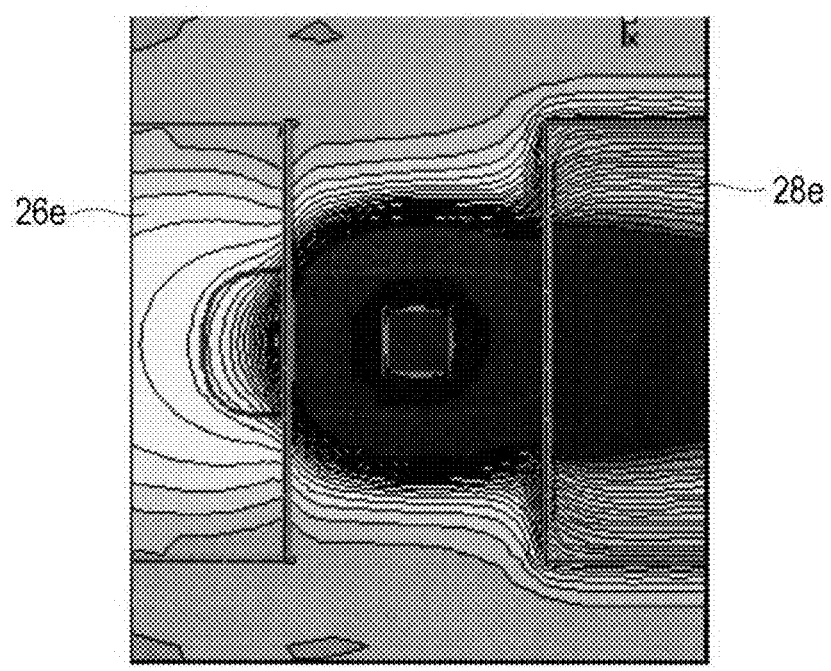
FIG. 7B is a contour diagram depicting the result of a simulation for investigating the distribution of a depletion layer in a configuration in which the concentration of boron in the third region is sufficiently low.

FIG. 7B depicts the result of a simulation for investigating the distribution of a depletion layer in a configuration in which the concentration of boron in the third region 72p is sufficiently low. As depicted in FIG. 7B, the depletion layer spread greatly to below the gate electrode 28e of the protection transistor 28.

As can be understood from a comparison between FIGS. 7A and 7A, it is possible to suppress the depletion layer spreading to below the gate electrode 28e by implanting a sufficient amount of boron in the third region 72p below the gate electrode 28e of the protection transistor 28. If spreading of the depletion layer can be suppressed, leakage current can also be reduced. As a result, it is possible to provide an imaging device 100 that is able to generate higher quality images.

Figure 5B:
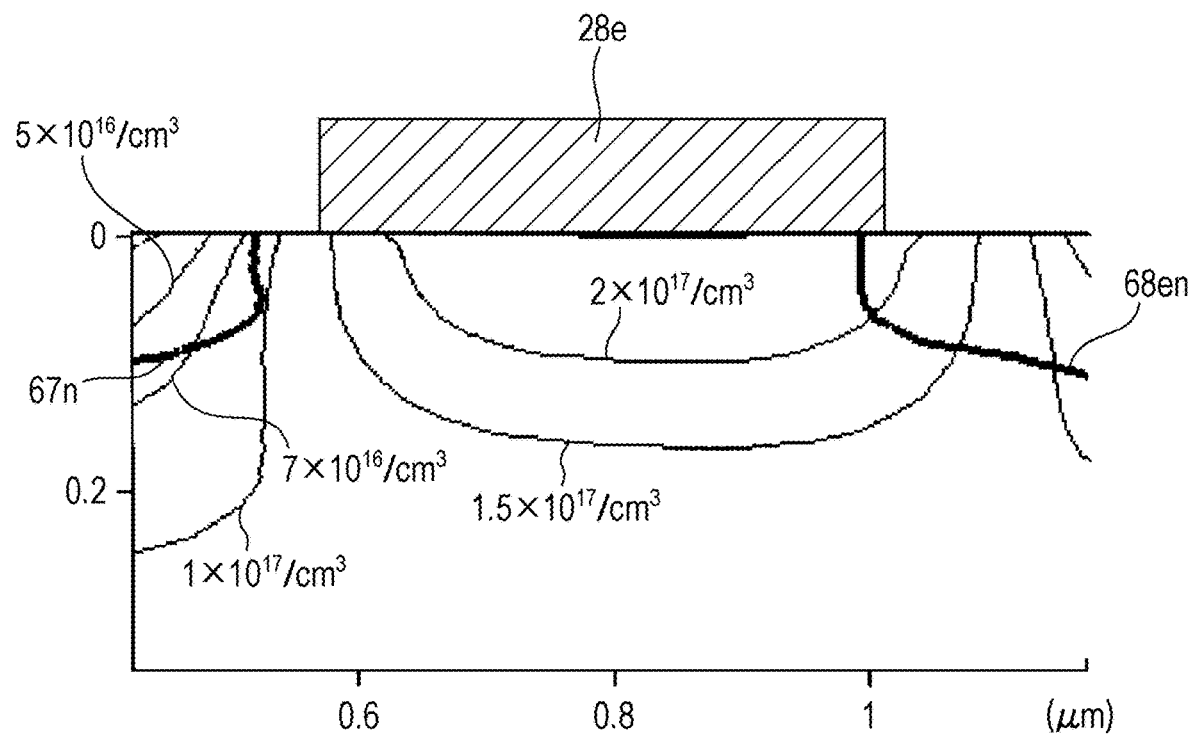
FIG. 5B is a contour diagram depicting the concentration distribution of an acceptor in the model of FIG. 4B.

According to FIGS. 5A, 5B, and 6, the ratio of the concentration of a p-type impurity in the third region 72p with respect to the concentration of a p-type impurity in the second region 70p is greater than or equal to 1.5, for example. The upper limit for the ratio is not particularly restricted, and is 100, for example. Leakage current can be sufficiently reduced by appropriately adjusting the concentrations of impurities in each region of the second region 70p and the third region 72p.

Figure 4B:
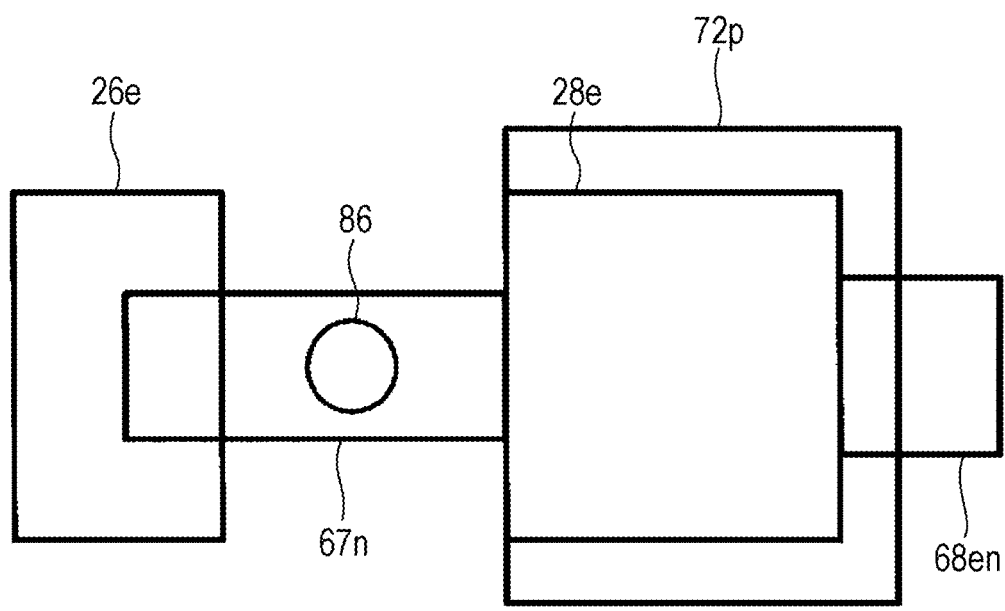
FIG. 4B is a model used in a simulation, and is a plan view depicting another positional relationship between the gate electrode of the reset transistor, the n-type impurity region, the gate electrode of the protection transistor, and the third region.

Similar to FIG. 4A, FIG. 4B is a model used in a simulation and depicts a plan view of another positional relationship between the gate electrode 26e of the reset transistor 26, the n-type impurity region 67n, the gate electrode 28e of the protection transistor 28, and the third region 72p. In the model of FIG. 4B, the third region 72p is in contact with the n-type impurity region 67n. That is, the distance D2 between the n-type impurity region 67n and the third region 72p is zero.

FIG. 5B depicts the concentration distribution of an impurity in the model of FIG. 4B. The dose amount of the impurity implanted in the third region 72p was $4 \times 10^{12}$ atoms/cm$^2$. According to the model depicted in FIG. 4B, the third region 72p in which boron is included at a high concentration spreads to the extent of being adjacent to the n-type impurity region 67n.

Spreading of the depletion layer is suppressed and a similar result to that of FIG. 7A is obtained also in the case where the model depicted in FIGS. 4B and 5B is used.

The concentration distributions depicted in FIGS. 5A, 5B, and 6 are calculated considering the effect of element diffusion and the like, and indicate good agreement with the distributions in an actual unit pixel 10.

It should be noted that, in an actual unit pixel 10, the concentration of an impurity in each region can be measured by means of scanning capacitance microscopy (SCM), for example.

MODIFIED EXAMPLE 1

Figure 8:
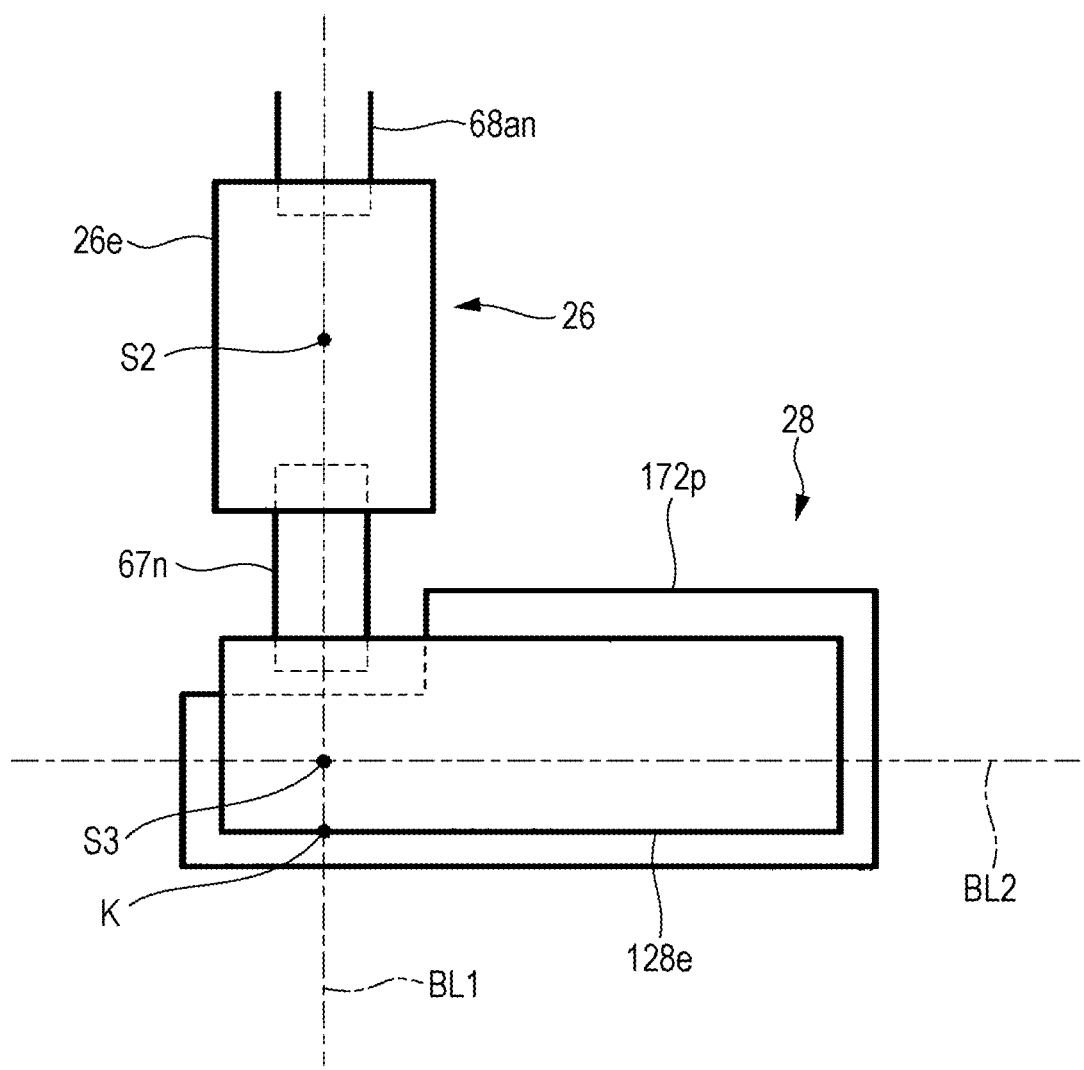
FIG. 8 is a plan view depicting another layout of the gate electrode of the reset transistor, the n-type impurity region, and the gate electrode of the protection transistor.

FIG. 8 is a plan view depicting another layout of the gate electrode of the reset transistor, the n-type impurity region, and the gate electrode of the protection transistor. In the present modified example, in plan view, a gate electrode 128e of the protection transistor 28 has a rectangular shape. Meanwhile, in plan view, a third region 172p below the gate electrode 128e overall has a non-rectangular shape. One long side of the gate electrode 128e intersects the n-type impurity region 67n. The plan view shape of the third region 172p is determined so as to avoid an overlapping region between the gate electrode 128e and the n-type impurity region 67n.

In the present modified example, for example, when the concentration of a p-type impurity at a predetermined location S3 in the third region 172p and the concentration of a p-type impurity at a predetermined location S2 in the second region 70p are measured, the former value is higher than the latter value. The predetermined location S2 in the second region 70p can be a position including an intersecting point between the surface of the second region 70p and a line normal to the gate electrode 26e passing through the center of gravity of the gate electrode 26e when the imaging device 100 is seen in plan view. When an intersecting point between a center line BL1 in the gate length direction of the gate electrode 26e and a center line BL2 of the gate electrode 128e in the direction parallel with the gate width direction of the gate electrode 26e is defined as a specific intersecting point, the predetermined location S3 in the third region 172p can include an intersecting point between the surface of the third region 172p and a line normal to the gate electrode 128e passing through the specific intersecting point. According to this kind of configuration, it is possible to suppress spreading of the depletion layer regardless of the shape of the gate electrode 128e.

The aforementioned "predetermined location S2" and "predetermined location S3" are each to be treated as a "very small region centered about one point" rather than a "point". The surface of the second region 70p and the surface of the third region can be the surface of the semiconductor substrate 60. The "gate length direction" means a direction that is perpendicular to the thickness direction of the gate electrode and parallel with the direction in which current flows between the source and the drain. The "gate width direction" means a direction that is perpendicular to the thickness direction of the gate electrode and perpendicular to the gate length direction.

Figure 9:
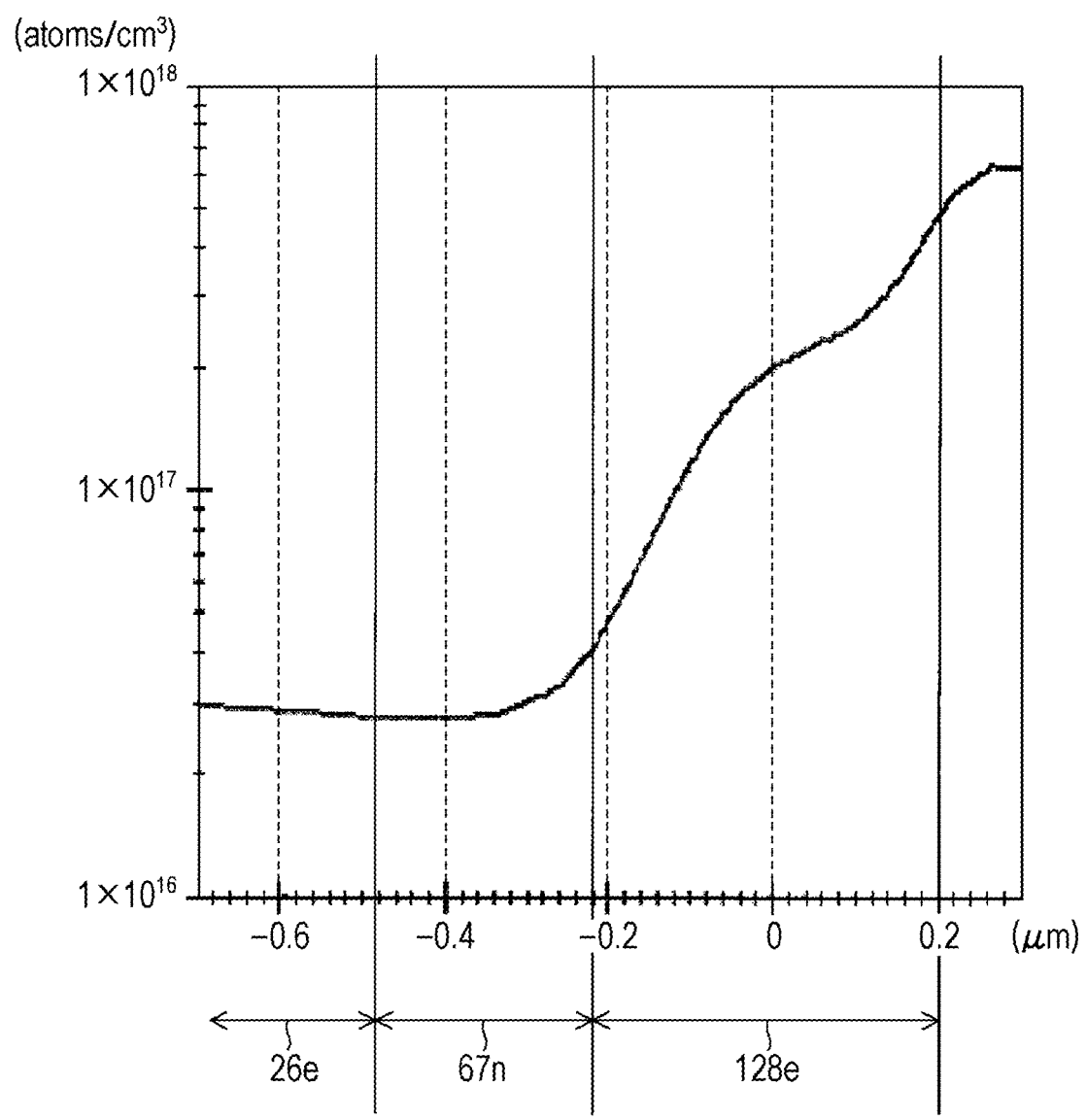
FIG. 9 is a graph depicting a concentration profile for boron in the vicinity of the surface of the semiconductor substrate in the model of FIG. 8.

FIG. 9 depicts a concentration profile for boron in the vicinity of the surface of the semiconductor substrate 60 in the model of FIG. 8, and a concentration profile for boron from the predetermined location S2 to a predetermined location K. The predetermined location K corresponds to an intersecting point between an outer edge of the gate electrode 128e and the center line BL1. The horizontal axis of FIG. 9 represents the distance from the center of the gate electrode 128e of the protection transistor 28. The vertical axis represents the concentration of boron. The largest value for the concentration of boron is indicated at the predetermined location K, which is the effect of an adjacent element isolation region 69.

As depicted in FIG. 9, the concentration of boron in the third region 172p below the gate electrode 128e of the protection transistor 28, overall, was higher than the concentration of boron in the second region 70p below the gate electrode 26e of the reset transistor 26. The largest value $C_{OF}$ for the concentration of boron in the third region 172p was greater than the largest value $C_{RS}$ for the concentration of boron in the second region 70p. In the second region 70p below the gate electrode 26e of the reset transistor 26 and the n-type impurity region 67n, the concentration of boron was generally constant at $3\times10^{16}$ atoms/cm$^3$. That is, in this example, boron is not implanted in the second region 70p.

MODIFIED EXAMPLE 2

Figure 10:
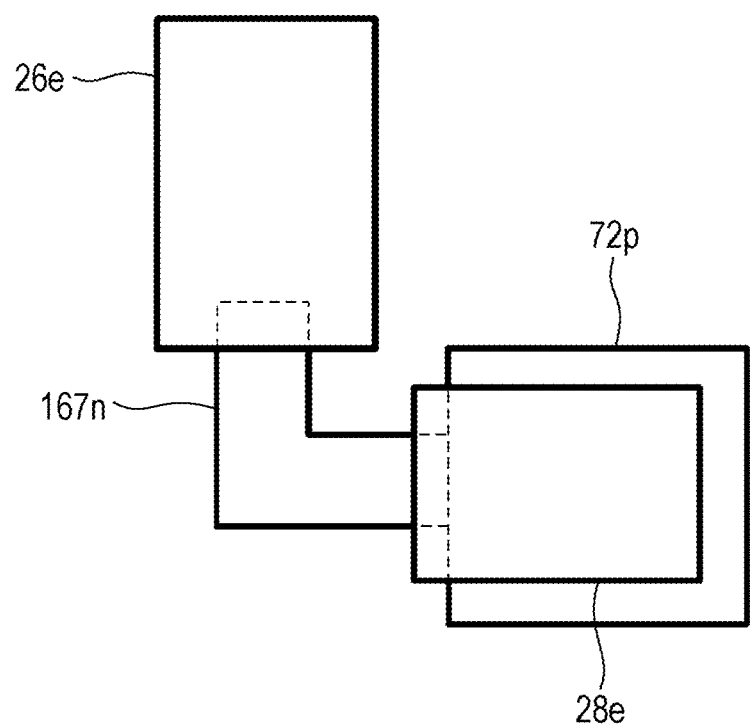
FIG. 10 is a plan view depicting yet another layout of the gate electrode of the reset transistor, the n-type impurity region, and the gate electrode of the protection transistor.

FIG. 10 is a plan view depicting yet another layout of the gate electrode of the reset transistor, the n-type impurity region, and the gate electrode of the protection transistor. In the present modified example, an n-type impurity region 167n is part of the charge accumulation region and is the first region. The n-type impurity region 167n has an L-shape in plan view. That is, the shape of the n-type impurity region serving as the charge accumulation region is not restricted to a rectangle. The gate electrode 26e of the reset transistor 26 overlaps one end of the L-shaped n-type impurity region 167n in plan view. The gate electrode 28e of the protection transistor 28 overlaps the other end of the L-shaped n-type impurity region 167n in plan view. A p-type impurity is doped in the third region 72p below the gate electrode 28e. According to this kind of configuration, it is possible to suppress a depletion layer spreading to below the gate electrode 28e regardless of the shape of the n-type impurity region 167n.

As described above, according to the embodiment of the present disclosure, the effects of leakage current can be suppressed, and therefore an imaging device that is capable of carrying out imaging with high image quality is provided. It should be noted that each of the aforementioned amplification transistor 22, address transistor 24, reset transistor 26, and protection transistor 28 may be an N-channel MOSFET or may be a P-channel MOSFET. In the case where the protection transistor 28 is a P-channel MOSFET, the conductivity type of the gate electrode 28e may be an n-type, and the aforementioned power source voltage VDD may be substituted with a power source voltage VSS. Furthermore, it is not necessary for these transistors to all be either N-channel MOSFETs or P-channel MOSFETs.

It should be noted that negative charge may be used as signal charge from among the positive and negative charge generated by means of photoelectric conversion. In a case where negative charge is used as signal charge and a P-channel MOSFET is used as the protection transistor 28, polysilicon having n-type conductivity may be used as the gate electrode 28e of the protection transistor 28. It is thereby possible to suppress the formation of a depletion layer below the gate electrode 28e of the protection transistor 28 and reduce dark current. Furthermore, a material having a work function of the same level as that of polysilicon having n-type conductivity may be used as the gate electrode 28e of the protection transistor 28. Here, the work function of N$^+$ polysilicon is 4.05 eV. Consequently, for example, Hf (3.9 eV), TaN (4.05 eV), Al (4.13 eV), Ti (4.14 eV), Nb (4.15 eV), or Ta (4.19 eV) may be used as the gate electrode 28e. Furthermore, a constant effect is obtained with a material having a work function that is less than that of P$^+$ polysilicon (5.17 eV). In other words, the aforementioned mid-gap metals can also be used, for example. The work function of the material of the gate electrode 28e of the protection transistor 28 may be less than 5.17 eV or may be in the range from 3.3 eV to 4.2 eV. In a case where negative charge is used as signal charge and a P-channel MOSFET is used as the protection transistor 28, the effect of reducing leakage current can be obtained by using the aforementioned material for the gate electrode 28e.

Furthermore, in a case where negative charge is used as signal charge, a voltage that is higher than the power source voltage VDD (or the power source voltage VSS) supplied to the amplification transistor 22 is supplied to the n-type (or p-type) impurity region 68en of the protection transistor 28. In other words, the voltage supplied to the n-type (or p-type) impurity region 68en of the protection transistor 28 is a voltage that is different from the power source voltage VDD (or the power source voltage VSS), and is a voltage of the same side as the reset voltage with respect to the power source voltage VDD (or the power source voltage VSS). It is thereby possible for excessive charge to be discharged from the n-type (or p-type) impurity region 67n at a higher gate voltage while reducing off-leakage current. In other words, a more stable operation in the protection transistor 28 can be realized. It should be noted that a stabilization effect can be obtained also in this case regardless of the material of the gate electrode 28e of the protection transistor 28.

It should be noted that, in either case where positive or negative charge is used as signal charge, the absolute value of the difference between the reset voltage and the voltage supplied to the n-type (or p-type) impurity region 68en of the protection transistor 28 may be less than the absolute value of the difference between the reset voltage and the power source voltage VDD (or the power source voltage VSS). Furthermore, the voltage supplied to the n-type (or p-type) impurity region 68en of the protection transistor 28 may be a voltage that is between the reset voltage and the power source voltage VDD (or the power source voltage VSS).

What is claimed is:

1. An imaging device comprising:
a semiconductor layer that includes a first region of a first conductivity type, a second region of a second conductivity type that is an opposite conductivity type to the first conductivity type, and a third region of the second conductivity type;
a photoelectric converter that is electrically connected to the first region and that converts incident light into charge;
a first transistor that includes a first source, a first drain, and a first gate, the first gate being located above the second region; and
a second transistor that includes a second source, a second drain, and a second gate of the second conductivity type, the second gate being located above the third region and directly connected to the first region by an electrically conductive pattern, wherein:
the first region corresponds to the first source or the first drain in the first transistor,
the first region corresponds to the second source or the second drain in the second transistor, and
a concentration of an impurity of the second conductivity type in the third region is higher than a concentration of an impurity of the second conductivity type in the second region.

2. The imaging device according to claim 1,
wherein the impurity of the second conductivity type included in the third region is a same type of element as the impurity of the second conductivity type included in the second region.

3. The imaging device according to claim 1, wherein:
the concentration of the impurity of the second conductivity type in a first predetermined location in the third region is higher than the concentration of the impurity of the second conductivity type in a second predetermined location in the second region,
the second predetermined location includes an intersecting point between a surface of the second region and a line normal to the first gate passing through a center of gravity of the first gate when the imaging device is seen in plan view, and,
when an intersecting point between a center line of the first gate in a gate length direction of the first gate and a center line of the second gate in a direction parallel with a gate width direction of the first gate is defined as a specific intersecting point, the first predetermined location includes an intersecting point between a surface of the third region and a line normal to the second gate passing through the specific intersecting point.

4. The imaging device according to claim 1,
wherein, when the imaging device is seen in plan view, the third region extends outside the second gate.

5. The imaging device according to claim 1,
wherein the concentration of the impurity of the second conductivity type at a location, separated by a predetermined distance from the first region, in the third region is higher than the concentration of the impurity of the second conductivity type at a location, separated by the predetermined distance from the first region, in the second region.

6. The imaging device according to claim 1,
wherein the first gate is of the first conductivity type.

* * * * *